US011059228B2

(12) United States Patent
Elber et al.

(10) Patent No.: US 11,059,228 B2
(45) Date of Patent: Jul. 13, 2021

(54) SYSTEMS AND METHODS FOR PRINTING OF 3D MODELS

(71) Applicant: Technion Research & Development Foundation Limited, Haifa (IL)

(72) Inventors: Gershon Elber, Haifa (IL); Ben Ezair, Haifa (IL)

(73) Assignee: Technion Research & Development Foundation Limited, Haifa (IL)

( * ) Notice: Subject to any disclaimer, the term of this patent is extended or adjusted under 35 U.S.C. 154(b) by 72 days.

(21) Appl. No.: 16/323,789

(22) PCT Filed: Aug. 10, 2017

(86) PCT No.: PCT/IL2017/050890
§ 371 (c)(1),
(2) Date: Feb. 7, 2019

(87) PCT Pub. No.: WO2018/029694
PCT Pub. Date: Feb. 15, 2018

(65) Prior Publication Data
US 2019/0210288 A1    Jul. 11, 2019

(30) Foreign Application Priority Data

Aug. 11, 2016 (IL) .......................................... 247245

(51) Int. Cl.
*B29C 64/386* (2017.01)
*B33Y 50/00* (2015.01)
(Continued)

(52) U.S. Cl.
CPC ...... *B29C 64/386* (2017.08); *B29D 11/00009* (2013.01); *B29D 11/00432* (2013.01);
(Continued)

(58) Field of Classification Search
CPC ....... B29C 64/386; B29C 64/10; G06F 30/00; G06F 9/3004; B29D 11/00432;
(Continued)

(56) References Cited

U.S. PATENT DOCUMENTS 5,390,292 A    2/1995  Takamura et al.
6,154,215 A *  11/2000  Hopcroft ............... G06T 11/206
                                                    345/418
(Continued)

FOREIGN PATENT DOCUMENTS

EP          3003691          4/2016
JP         3476710 B2  *    12/2003
WO       WO 2018/029694      2/2018

OTHER PUBLICATIONS

International Preliminary Report on Patentability dated Feb. 21, 2019 From the International Bureau of WIPO Re. Application No. PCT/IL2017/050890. (9 Pages).
(Continued)

*Primary Examiner* — Jigneshkumar C Patel

(57) ABSTRACT

There is provided a method of representing a three dimensional (3D) object using univariate curves, comprising: receiving an initial definition of a 3D object representation, calculate a covering set of univariate curves, the covering set comprising at least one non-planar univariate curve, wherein the covering set of univariate curves represent the volume of the 3D object within a tolerance requirement, and generating a representation of the 3D object based on the set of univariate curves, wherein the set of univariate curves represent the volume of the 3D object.

19 Claims, 20 Drawing Sheets

(51) Int. Cl.
| | | |
|---|---|---|
| *B29D 11/00* | (2006.01) | |
| *G06F 9/30* | (2018.01) | |
| *G06T 19/20* | (2011.01) | |
| *G06T 17/05* | (2011.01) | |
| *G06T 17/00* | (2006.01) | |
| *G06F 30/00* | (2020.01) | |

(52) U.S. Cl.
CPC ............ *B33Y 50/00* (2014.12); *G06F 9/3004* (2013.01); *G06F 30/00* (2020.01); *G06T 17/00* (2013.01); *G06T 17/05* (2013.01); *G06T 19/20* (2013.01); *G06T 2219/2021* (2013.01)

(58) Field of Classification Search
CPC ... B29D 11/00009; G06T 17/00; G06T 19/20; G06T 17/05; G06T 2219/2021; B33Y 50/00; G05B 19/4099
See application file for complete search history.

(56) References Cited

U.S. PATENT DOCUMENTS

| | | | | |
|---|---|---|---|---|
| 6,476,809 | B1* | 11/2002 | Browne ................. | G06T 11/40 345/423 |
| 6,608,631 | B1* | 8/2003 | Milliron ................. | G06T 13/00 345/619 |
| 2003/0080957 | A1* | 5/2003 | Stewart .................. | G06F 30/15 345/420 |
| 2006/0119578 | A1* | 6/2006 | Kesavadas ............ | G06F 3/0481 345/161 |
| 2009/0040218 | A1* | 2/2009 | Museth .................. | G06T 17/30 345/420 |
| 2012/0299917 | A1 | 11/2012 | Kumar | |
| 2013/0127857 | A1 | 5/2013 | Carr et al. | |
| 2013/0135302 | A1* | 5/2013 | Bonner .................. | G06T 17/30 345/420 |
| 2014/0107823 | A1* | 4/2014 | Huang .................... | G06F 30/00 700/98 |
| 2014/0137965 | A1 | 5/2014 | Truitt et al. | |
| 2014/0303764 | A1 | 10/2014 | Boyl-Davis et al. | |
| 2015/0186929 | A1 | 7/2015 | Thies et al. | |
| 2015/0199470 | A1* | 7/2015 | Young .................... | G06F 30/15 700/98 |
| 2015/0352792 | A1 | 12/2015 | Kanada | |
| 2015/0367576 | A1* | 12/2015 | Page ..................... | B29C 64/112 264/257 |
| 2016/0075089 | A1* | 3/2016 | Duro Royo ........... | B29C 64/118 264/308 |
| 2016/0085809 | A1 | 3/2016 | De Castro Alves et al. | |
| 2016/0101573 | A1* | 4/2016 | Quere ................. | B29D 11/0098 264/1.1 |
| 2016/0188770 | A1 | 6/2016 | Montana et al. | |
| 2016/0200011 | A1 | 7/2016 | Rothfuss et al. | |
| 2017/0220946 | A1* | 8/2017 | Thielen .................. | B33Y 50/00 |
| 2017/0248937 | A1* | 8/2017 | Guimbretiere ......... | B33Y 50/00 |
| 2018/0086045 | A1* | 3/2018 | Morovic ................ | H04N 1/405 |

OTHER PUBLICATIONS

International Search Report and the Written Opinion dated Dec. 5, 2017 From the International Searching Authority Re. Application No. PCT/IL2017/050890. (19 Pages).

Office Action dated Sep. 5, 2017 From the Israel Patent Office Re. Application No. 247245 and Its Translation Into English. (6 Pages).

Office Action dated Sep. 25, 2016 From the Israel Patent Office Re. Application No. 247245. (2 Pages).

Office Action dated Mar. 29, 2018 From the Israel Patent Office Re. Application No. 247245 and Its Translation Into English. (4 Pages).

Response dated Jan. 16, 2017 to Office Action dated Sep. 25, 2016 From the Israel Patent Office Re. Application No. 247245. (1 Page).

Allen et al. "An Experimental Demonstration of Effective Curved Layer Fused Filament Fabrication Utilising A Parallel Deposition Robot", Additive Manufacturing, 8: 78-87, Available Online Sep. 25, 2015.

Chakraborty et al. "Extruder Path Generation for Curved Layer Fusion Deposition Modeling", Computer-Aided Design, 40(2): 235-243, Feb. 2008.

Davis et al. "Algorithms for Multilayer Conformal Additive Manufacturing", Journal of Computing and Information Science in Engineering, 16(2): 021003-1-021003-12, Published OnlineApr. 15, 2016.

Invitation Pursuant to Rule 63(1) EPC dated Mar. 10, 2020 From the European Patent Office Re, Application No. 17838934.2. (5 Pages).

Supplementary Partial European Search Report and the Provisional Opinion dated Jul. 27, 2020 From the European Patent Office Re, Application No. 17838934.2. (21 Pages).

Massarwi et al. "A B-Spline Based Framework for Volumetric Object Modeling", Computer Aided Design, XP029616583, 78: 36-47, Sep. 1, 2016.

* cited by examiner

Algoritm 1 CoverVolumeWithSurfaces

Input:

(1) $V(u,v,w):D \to R^3$, a trivariate volume, $D=[0,1]^3$;

(2) $m$, a minimal subdivision depth to apply to $V$;

(3) $\varepsilon$, the maximum desired distance from a point in the volume to a covering surface;

Output:

(1) $S = \{S_1(u,v)...S_n(u,v)\}$, $w$ iso-parametric surfaces covering $V$ to within $\varepsilon$;

Algorithm:
CoverVolumeWithSurfaces$(V(u,v,w), m, \varepsilon)$

1: Return $V(u,v,0) \cup$
        CoverSubVolumeWithSurfaces$(V(u,v,w),(0,1),m,\varepsilon) \cup$
        $V(u,v,1)$;

CoverSubVolumeWithSurfaces$(V(u,v,w),(w_{low},w_{high}),m,\varepsilon)$

2:  $S_{list} := \emptyset$;
  3:  $D(u,v) := V(u,v,w_{low}) - V(u,v,w_{high})$;
  4:  $\Delta^2_{iso}(u,v) := \|D(u,v)\|^2$;
  5:  if $\Delta^2_{iso}(u,v) > \varepsilon^2$ for some $(u,v)$ or $m > 0$ then
  6:    $w_{mid} := \dfrac{w_{low}+w_{high}}{2}$,
  7:    if $m > 0$ then
  8:       $S^t_{mid}(u,v) := V(u,v,w_{mid})$
  9:    else
10:       $S_{mid}(u,v) := V(u,v,w_{mid})$
11:       $D'(u,v) := \{(u,v) | (\Delta^2_{iso}(u,v) - \varepsilon^2) > 0\}$;
12:       $S^t_{mid}(u,v) := \{S_{mid}(u,v) | ((u,v) \in D'(u,v))\}$; // $S^t_{mid}$ is a trimmed surface, with $D'(u,v)$
                                                      // as trimming domain
13:    end if
14:    $S_{list} :=$ CoverSubVolumeWithSurfaces$(V(u,v,w),(w_{low},w_{mid}),m-1,\varepsilon) \cup$
            $S^t_{mid}(u,v) \cup$
            CoverSubVolumeWithSurfaces$(V(u,v,w),(w_{mid},w_{high}),m-1,\varepsilon)$;
15: end if
16: Return $S_{list}$;

SYSTEMS AND METHODS FOR PRINTING OF 3D MODELS

BACKGROUND

The present invention, in some embodiments thereof, relates to geometric modeling and, more specifically, but not exclusively, to 3D printing of geometric models.

Additive manufacturing (AM) methods are based on dividing a 3D model (often represented as a polygonal mesh) into a series of two dimensional parallel planes (parallel to the printing surface of the 3D printer), also termed slices. The 3D printer deposits material according to each slice, printing the 3D model from the bottom up, one layer at a time. Additional detail of slicing based AM systems may be found, for example, with reference to Pulak Mohan Pandey, N Venkata Reddy, and Sanjay G Dhande. Slicing procedures in layered manufacturing: a review. *Rapid prototyping journal*, 9(5):274-288, 2003.

For example, the surface finish and/or the strength of the object is not optimal, being influenced by the slicing orientation and/or the print-path used to print the slice.

Better 3D printing systems and methods are being developed to improve the quality of the 3D printed object.

SUMMARY

According to an aspect of some embodiments of the present invention there is provided a method of representing the volume of a three dimensional (3D) object, comprising: receiving an initial definition of a 3D object representation; calculating a covering set of univariate curves, the covering set comprising at least one non-planar univariate curve, wherein the covering set of univariate curves represent the volume of the 3D object within a tolerance requirement; and generating a representation of the 3D object based on the set of univariate curves, wherein the set of univariate curves represent the volume of the 3D object.

Optionally, the covering set of univariate curves are computed based on a plurality of non-planar bivariate parametric surfaces covering wherein the 3D object, wherein the 3D object comprises at least one trivariate, within the tolerance requirement, and further comprising fitting each of the plurality of surfaces with at least one univariate curve.

Optionally, the method further comprises defining at least one external directional vector field enclosing the 3D object, and wherein covering comprises fitting each of the plurality of curves according to the at least one external directional vector field to create the covering set of univariate curves.

Optionally, the method further comprises clipping the plurality of curves to be inside the boundaries of the 3D object.

Optionally, covering comprises dividing the volume enclosed by the boundaries of the 3D representation into a plurality of discrete volumetric cells, covering each cell by tracing a freeform curve from the center of each respective discrete cell, wherein all accessible cells without any other cell below them are uniquely covered by curves and removed from the 3D object, until no more uncovered cells remain, and further comprising terminating the tracing of the freeform curve when another covered discrete cell is encountered or when the freeform curve leaves the volume of the respective discrete cell. Optionally, the volume enclosed by the boundaries of the 3D representation is divided into dexel (depth) cells. Optionally, the freeform curve is traced following a direction according to an external vector field.

Optionally, covering comprises creating a set of univariate curves in the domain of each trivariate in the 3D object and mapping the curves, using curve-trivariate function composition, to Euclidean space.

Optionally, the 3D object comprises at least one trimmed trivariate.

Optionally, the method further comprises printing the 3D object by an additive manufacturing system using the set of univariate curves as printing paths.

Optionally, the method further comprises performing at least one of fiber placement and composite material manufacturing using the set of univariate curves as layout paths.

Optionally, the plurality of non-planar bivariate parametric surfaces are iso-parametric surfaces of a trivariate parametric volume representation of the 3D object representation.

Optionally, the at least one univariate curve is an iso-parametric curve of a trivariate parametric volume representation of the 3D object representation.

Optionally, at least one additional external field represents one or more property selected from the group consisting of: color, transparency, a surface finish, a mechanical strength or stiffness, and graded-, anisotropic-, heterogeneous-material properties, and each of such field further comprising assigning to each curve-member of the set of covering univariate curves, a value for a parameter denoting the field's value when the respective curve-member is used as a printing path, wherein the parameter is variable along the length of each curve-member.

Optionally, the method further comprises ordering the set of univariate curves for printing by a 3D printing head along each curve-member of the set of univariate curves, wherein the ordering is selected such that during the 3D printing process curves that are not yet printed and have no unprinted curves below them are printed.

Optionally, the method further comprises computing a directed graph that stores the ordering of printing the set of univariate curves, wherein each curve-member is assigned to a vertex of the directed graph, and a directed edge between two vertexes exists when a first of the two vertexes is below a second of the two vertexes relative to the 3D printing head, in full 3-axis additive manufacturing 3D printing, wherein when the directed graph is acyclic the directed graph represents a 3D printable ordering of the set of univariate curves.

Alternatively or additionally, the method further comprises computing a directed graph that stores the ordering of printing the set of univariate curves, wherein each curve-member is assigned to a vertex of the directed graph, and a directed edge between two vertexes exists when a first of the two vertexes is below a second of the two vertexes relative to the 3D printing head, in 5-axis additive manufacturing 3D printing, wherein when the directed graph is acyclic the directed graph represents a 3D printable ordering of the set of univariate curves.

Alternatively or additionally, the method further comprises identifying a cycle in the directed graph that represents an impossible-to-print subset of univariate curves, and dividing at least one of the subset of univariate curves to remove the cycle from the directed graph.

Optionally, the directed graph is computed by dividing each curve-member of the set of univariate curves into a plurality of fragments each having a length less than a fragmentation tolerance, and iteratively merging pairs of the plurality of fragments while maintaining an acyclic directed graph. Optionally, the fragmentation tolerance corresponds to a minimum height of material deposited by the 3D printing head.

Optionally, the method further comprises assigning to each curve-member of the set of univariate curves, a value for a parameter denoting an effective coverage radius indicative of the amount of local material for deposition by a 3D printing head when the respective curve-member is used as a printing path, wherein the parameter is variable along the length of each curve-member.

Optionally, the method further comprises defining a support volume for the set of covering univariate curves, and representing the support volume using support elements, wherein the support elements are printed before printing a portion of the set of univariate curves.

According to an aspect of some embodiments of the present invention there is provided a system for processing of a three dimensional (3D) object for manufacturing, comprising: a program store storing code; and a processor coupled to the program store for implementing the stored code, the code comprising: code to receive an initial definition of the 3D object, calculate a covering set of univariate curves, the covering set comprising at least one non-planar univariate curve, wherein the covering set of univariate curves represent the volume of the 3D object within a tolerance requirement; and generate a representation of the 3D object based on the covering set of univariate curves, wherein the covering set of univariate curves represents the volume defined by the 3D object.

According to an aspect of some embodiments of the present invention there is provided a computer program product comprising a non-transitory computer readable storage medium storing program code thereon for implementation by a processor of a system for processing of a 3D object, comprising: instructions to receive an initial definition of the 3D object; instructions to calculate a covering set of univariate curves, the covering set comprising at least one non-planar univariate curve, wherein the covering set of univariate curves represent the volume of the 3D object within a tolerance requirement; and instructions to generate a representation of the 3D object based on the covering set of univariate curves, wherein the covering set of univariate curves represent the volume define by the 3D object.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

BRIEF DESCRIPTION OF THE SEVERAL VIEWS OF THE DRAWINGS

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings:

FIG. 3 is pseudo code of a method for covering a trivariate volume using iso-parametric surfaces of the volume, in accordance with some embodiments of the present invention;

DETAILED DESCRIPTION

Figure 1A:
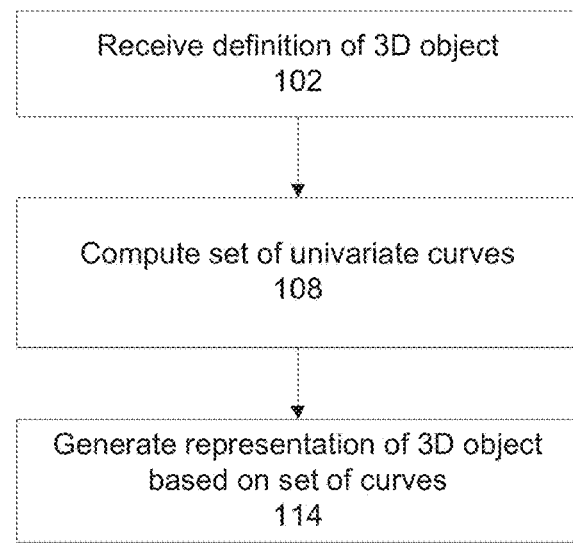
FIG. 1A is a flowchart of a method for generating a set of univariate curves that fill (i.e., cover) the volume of a 3D geometric object, in accordance with some embodiments of the present invention.

The present invention, in some embodiments thereof, relates to geometric modeling and, more specifically, but not exclusively, to covering (filling) the volume of a 3D geometric object using curves, optionally towards additive manufacturing (AM) of geometric models.

As used herein, the terms cover and fill are sometimes interchanged.

An aspect of some embodiments of the present invention relate to systems and/or methods (e.g., code instructions stored in a storage device executed by processor(s)) that generate a representation of a 3D geometric object using a set of univariate curves that fill and/or cover (within a tolerance requirement) the volume of the 3D geometric object. The univariate curves are general 3-space curves, do not necessarily lie in parallel planes, and/or the univariate curves are not necessarily parallel to each other. The univariate curves may define, for example, printing paths for a printing head of a three dimensional (3D) printer in an additive manufacturing (AM) machine.

Optionally, an initial definition of the 3D geometric object, optionally a (possibly trimmed) trivariate parametric volume representation, is covered (within the tolerance requirement) with non-planar and/or non-parallel bivariate parametric surfaces. Each of the surfaces is fitted with one or more univariate curves to create the covering set of univariate curves to the surface.

Optionally, the covering univariate curves are fitted to the 3D geometric object according to an external directional vector field (sometimes referred to herein as a directional field) that encloses the 3D object. The external vector field may define the directions of the curves. The curves are clipped according to the 3D object, such that the remaining curves are located within the 3D object Alternatively or additionally, the univariate curves are specified in the domain of the 3D geometric object, represented as a set of (optionally trimmed) trivariates, and a curve-trivariate function composition that is mapping the univariate covering set into Euclidean space.

Alternatively or additionally, the 3D volume enclosing the 3D object is divided into discrete volumetric cells, optionally as Dexels. Free form curve(s) are traced from the center (or another location) within each respective discrete cell.

Optionally, additional fields can specify values inside the 3D object, for example, color, transparency, material properties, and/or mechanical stiffness requirements.

Optionally, the curve-members of the set of univariate curves are ordered for printing by the 3D printing head. The ordering is based on printing the lower curves before higher curves. The ordering may be defined by a directed acyclic graph, where each vertex represents one or more curves and the directed edges represent a printing order between the curves of the respective vertexes. Cycles in the directed graph, which represent an impossible-to-print subset of univariate curves (e.g., printing of higher level curves before lower level curves, which is impossible without the printer head penetrating and damaging the higher level curve to print the lower level curve) may be removed by dividing at least one of the univariate curves in the subset.

The systems and/or methods (e.g., code instructions stored in a storage device executed by processor(s)) provided herein provide, as an example, a technical solution to the technical problem of improving the process of 3D printing (i.e., AM) a 3D geometric object, optionally a trivariate parametric volume representation. The technical problem may include improvement of the surface finish, mechanical strength, and/or material properties of the 3D printed object.

The systems and/or methods (e.g., code instructions stored in a storage device executed by processor(s)) provided herein improve performance of a 3D printing system (e.g., AM system or other systems that manufacture a 3D object) by creating a set of univariate curves based on the 3D geometric object representation, that when printed improve the surface finish, mechanical strength, and/or material properties of the 3D printed object. The improvement is in comparison to, for example, standard 3D printing systems that divide the 3D geometric object representation into multiple parallel slices, and print one slice at a time, from the bottom up.

Accordingly, the systems and/or methods described herein are inextricably tied to computer technology and 3D printing (i.e., AM) technology to overcome an actual technical problem arising in 3D printing of geometric objects.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

As used herein, the term additive manufacturing, and 3D printing are interchangeable.

As used herein, the term object and geometric object are interchangeable.

Inventors realized that traditional AM manufacturing methods that slice the representation of the 3D object into parallel planes create slices that are not intrinsic to the original 3D object representation, and may result in inferior mechanical strength, material properties, surfaces finishes, and the like, that would otherwise be possible.

The systems and/or methods (e.g., code executable by processor(s)) described herein that create the set of univariate curves, address technical challenges that are not solved by other methods. Although other attempts have been made to print 3D objects without slicing, such methods do not provide complete coverage of the volume of the 3D object and leave unsolved technical challenges that are addressed by the systems and/or methods described herein. The exemplary other attempts are based on dictating printing directions that are independent of the model, or the methods are limited to specific simple geometries.

For example, Stefanie Mueller, Sangha Im, Serafima Gurevich, Alexander Teibrich, Lisa Pfisterer, Francois Guimbretiere, and Patrick Baudisch. Wireprint: 3d printed previews for fast prototyping. In *Proceedings of the 27th annual ACM symposium on User interface software and technology*, pages 273-280. ACM, 2014, appears to describe how a wireframe on the boundary of an object can be printed directly without slicing to quickly create a visual representation of the object. However, only a wireframe representation of the boundary is created by this method.

For example, Dave Bourell, Brent Stucker, Yong Chen, Chi Zhou, and Jingyuan Lao. A layerless additive manufacturing process based on cnc accumulation. *Rapid Prototyping Journal*, 17(3):218-227, 2011, and Yayue Pan, Chi Zhou, Yong Chen, and Jouni Partanen. Multitool and multi-axis computer numerically controlled accumulation for fabricating conformal features on curved surfaces. *Journal of Manufacturing Science and Engineering*, 136(3):031007, 2014, appear to described how manually planned print-paths are used to create objects without slicing. The method relies on manual definitions by the user, and the focus appears to be on implementing and testing the hardware needed to accomplish the prints.

For example, Bin Huang, Sarat B Singamneni, R Ian Campbell, and Ian Gibson. Curved layer adaptive slicing (clas) for fused deposition modelling. *Rapid Prototyping Journal*, 21(4), 2015, appears to relate to non-planar slices that are created and used to print special geometries. However, not all objects are printable. The objects are limited to geometries that can be expressed as offsets of polygonal faces (e.g., as described with reference to Xiuzhi Qu and Brent Stucker. A 3d surface offset method for stl-format models. *Rapid Prototyping Journal*, 9(3):133-141, 2003), starting from the top (facing up) polygonal surface of the object. For example a sphere cannot be printed since the bottom is not an offset of the top, while an arch shaped bridge structure can be printed. The mentioned future work seeks to handle more complex geometries by subdividing an object, however, the division is into two groups: parts that can be printed using non-planar slices using the described method, and complex parts that are still printed using traditional slicing methods.

For example, Wei Gao, Yunbo Zhang, Diogo C Nazzetta, Karthik Ramani, and Raymond J Cipra. Revomaker: Enabling multi-directional and functionally-embedded 3d printing using a rotational cuboidal platform. *In Proceedings of the 28th Annual ACM Symposium on User Interface Software & Technology*, pages 437-446. ACM, 2015, appears to introduce an additional degree of freedom to 3D printing, and allow printing around a cuboid (box) object and creating slices in six different directions corresponding to the facets of the cuboid. However, the resulting object is, in essence, made of six traditionally sliced (and manufactured) objects fused together.

Figure 1B:
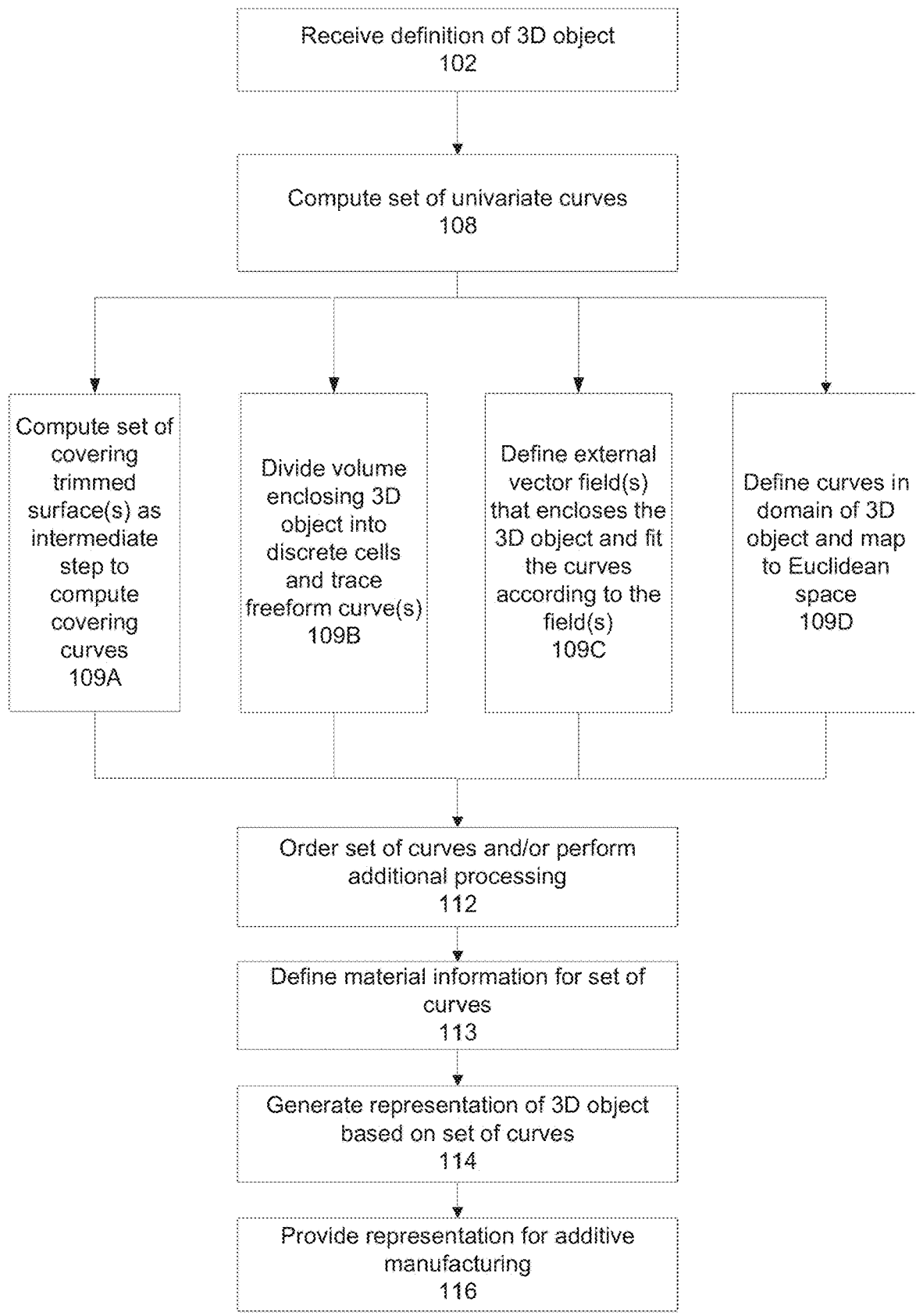
FIG. 1B is a flowchart of a method for generating the set of univariate curves, providing additional details to the method described with reference to FIG. 1A, in accordance with some embodiments of the present invention.
Figure 2:
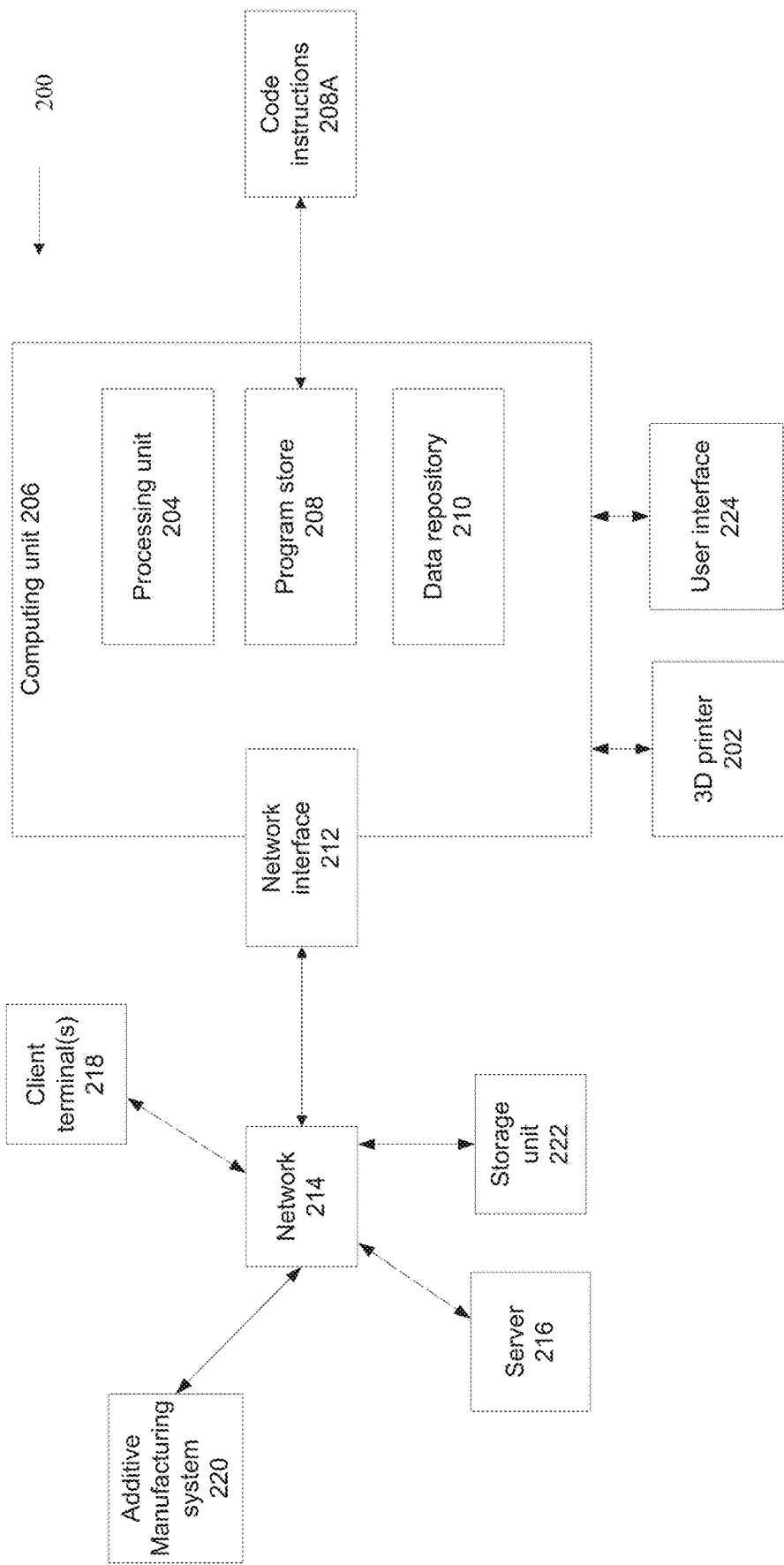
FIG. 2 is a block diagram of a system that generates the set of univariate curves for 3D printing of the 3D geometric object, in accordance with some embodiments of the present invention.

Reference is now made to FIG. 1A, which is a flowchart of a method for generating a representation of a 3D geometric object as a set of univariate curves that fill the volume of the 3D geometric object according to a tolerance requirement, in accordance with some embodiments of the present invention. FIG. 1B discussed below provides additional features to the method described with reference to FIG. 1A. Reference is also made to FIG. 2, which is a block diagram of a system 200 that generates the set of univariate curves for 3D printing of the 3D geometric object using the univariate curves as print paths for a printing head of a 3D printer 202, in accordance with some embodiments of the present invention. System 200 may execute the acts of the method described with reference to FIG. 1A, for example, by a processing unit 204 of a computing unit 206 executing code instructions stored in a program store 208.

The systems and/or methods described herein are designed to be generally applicable to any closed 3D object, by offering an intrinsic set of 3D printing paths based on the fitted univariate curves. The systems and/or methods described herein may process a general model provided as input, by automatically filling the entire volume (within the tolerance requirement) of the model with curves that fit each model's intrinsic specific structure and intrinsic requirement.

3D printer 202 prints 3D objects by depositing materials using a printer head that deposits materials. 3D printer 202 may be a standard existing printer (for example, designed to print parallel slices to create the 3D object, one slice at a time, from lower layers to higher layers) that is programmed with improved printing paths based on the generated set of univariate curves, as described herein.

Computing unit 206 may be integrated with 3D printer 202, for example, as a control console and/or control unit and/or instructions code stored within 3D printer 202. Alternatively or additionally, computer unit 206 may be implemented as a unit external to 3D printer 202, that creates the set of univariate curves that are provided (e.g., transmitted using a communication channel such as a network, or obtained from a storage device) to 3D printer 202 for use in guiding the printing of the 3D object. For example, computing unit 206 may be implemented as, for example, a client terminal, a server, a mobile device, a desktop computer, a thin client, a Smartphone, a Tablet computer, a laptop computer, a wearable computer, glasses computer, and a watch computer. Computing unit 206 may include locally stored software that performed one or more of the acts described with reference to FIGS. 1A-B, and/or may act as one or more servers (e.g., network server, web server, a computing cloud) that provides services (e.g., one or more of the acts described with reference to FIG. 1A-B) to one or more client terminals, for example, providing software as a service (SaaS) to the client terminal(s), providing an application for local download to the client terminal(s), and/or providing functions using a remote access session to the client terminals, such as through a web browser.

Processing unit 204 may be implemented, for example, as a central processing unit(s) (CPU), a graphics processing unit(s) (GPU), field programmable gate array(s) (FPGA), digital signal processor(s) (DSP), and application specific integrated circuit(s) (ASIC). Processing unit(s) 204 may include one or more processors (homogenous or heterogeneous), which may be arranged for parallel processing, as clusters and/or as one or more multi core processing units.

Program store 208 stores code instructions implementable by processing unit 204, for example, a random access memory (RAM), read-only memory (ROM), and/or a storage device, for example, non-volatile memory, magnetic media, semiconductor memory devices, hard drive, removable storage, and optical media (e.g., DVD, CD-ROM). For example, program store 208 may store code instructions 208A that executes one or more acts of the method described with reference to FIG. 1A-B.

Computing unit 206 may include a data repository 210 for storing data, for example, a computer aided design (CAD) application for use by a user to design the geometric object for printing, heuristic analysis code used to improve the computational efficiency of generating the set of univariate curves. Data repository 210 may be implemented as, for example, a memory, a local hard-drive, a removable storage unit, an optical disk, a storage device, and/or as a remote server and/or computing cloud (e.g., accessed using a network connection). It is noted that code instructions 208A may be stored in data repository 210, for example, with executing portions loaded into program store 208 for execution by processing unit 204.

Computing unit 206 may include a network interface 212 for connecting to a network 214, for example, one or more of, a network interface card, a wireless interface to connect to a wireless network, a physical interface for connecting to a cable for network connectivity, a virtual interface implemented in software, network communication software providing higher layers of network connectivity, and/or other implementations. Computing unit 206 may access one or more remote servers 216 using network 214, for example, to download the initial definition of the geometric object, and/or to provide the generated set of univariate curves.

Computing unit 206 may connect using network 214 (or another communication channel, such as through a direct link (e.g., cable, wireless) and/or indirect link (e.g., via an intermediary computing unit such as a server, and/or via a storage device) with one or more of:

Client terminal(s) 218, for example, when computing unit 206 acts as a server providing SaaS.

A remotely located additive manufacturing system 220 that manufactures the geometric object based on the generated set of univariate curves. It is noted that 3D printer 202 may be locally located and connected to computing unit 206 (e.g., integrated within, connected by a cable, connected by a short range wireless communication protocol, connected by a local network), and AM system 220 may be remotely located and connected to computing unit 206 using network 214.

A storage unit 222 that stores the initial definition of the geometric object (e.g., provided by client terminal 218, server 216, and/or used by computing unit 206 for remote storage) and/or the generated set of univariate curves (e.g., created by computing unit 206 for use, for example, by manufacturing system 220 for manufacturing the 3D object). Storage unit 222 may include, for example, a storage server, a computing cloud storage server, or other implementations.

Computing unit 206 includes or is in communication with a user interface 224 allowing a user to enter data and/or view presented data. Exemplary user interfaces 224 include, for example, one or more of, a touchscreen, a display, a keyboard, a mouse, and voice activated software using speakers and microphone.

One or more acts of the method described with reference to FIG. 1A-B may be implemented by code instructions 208A stored in program store 208 (and/or stored in data repository 210) executed by processing unit 204 of computing unit 206.

At 102, an initial definition of the 3D geometric object is received by computing unit 206. For example, the initial definition may be designed by a user using a design package using user interface 224, obtained from local or remote storage, transmitted by remote client 218, and the like.

Optionally, the 3D geometric object is represented as a set of (optionally trimmed) surfaces boundary representation (B-rep). Alternatively or additionally, the 3D geometric object is represented as a set of piecewise linear polygonal meshes B-rep. Alternatively or additionally, the 3D geometric object is represented as a trivariate parametric volume representation. Alternatively or additionally, the 3D geometric object is represented as a trimmed trivariate parametric volume representation, for example, as described with reference to Fady Massarwi and Gershon Elber. A B-spline based framework for volumetric object modeling. Computer Aided Design, Vol 78, pp 36-47, September 2016.

At 108, the 3D geometric object is covered with at least one non-planar univariate curve, to create a covering set of univariate curves within a tolerance requirement.

The set of univariate curves are general 3D curves, which is notably different than standard AM methods in which the print path are located along parallel slices that are filled with lines.

One or more curves may be inserted between two curves to satisfy the tolerance requirement when a distance metric between the two curves does not satisfy the tolerance requirement.

In terms of formal mathematic representation, consider the volume enclosed by a 3D geometric object, V. The desired tolerance (i.e., tolerance requirement) is denoted as $\varepsilon \in \mathbb{R}$. A valid curve covering of V is denoted by a set of n univariate parametric curves $C=\{C_1(t) \ldots C_n(t)\}$, so that for any point $p_v \in V$ there exists a point $p_c \in C_i(t)$, $C_i(t) \in C$, for which $\|p_c - p_v\| \leq \varepsilon$.

At 114, a representation of the 3D geometric object is generated based on the set of univariate curves. The set of univariate curves fill the volume of the 3D geometric object. The univariate curves may be used as print paths by a printing head of a 3D printer to create a physical representation of the 3D geometric object.

Figure 8:
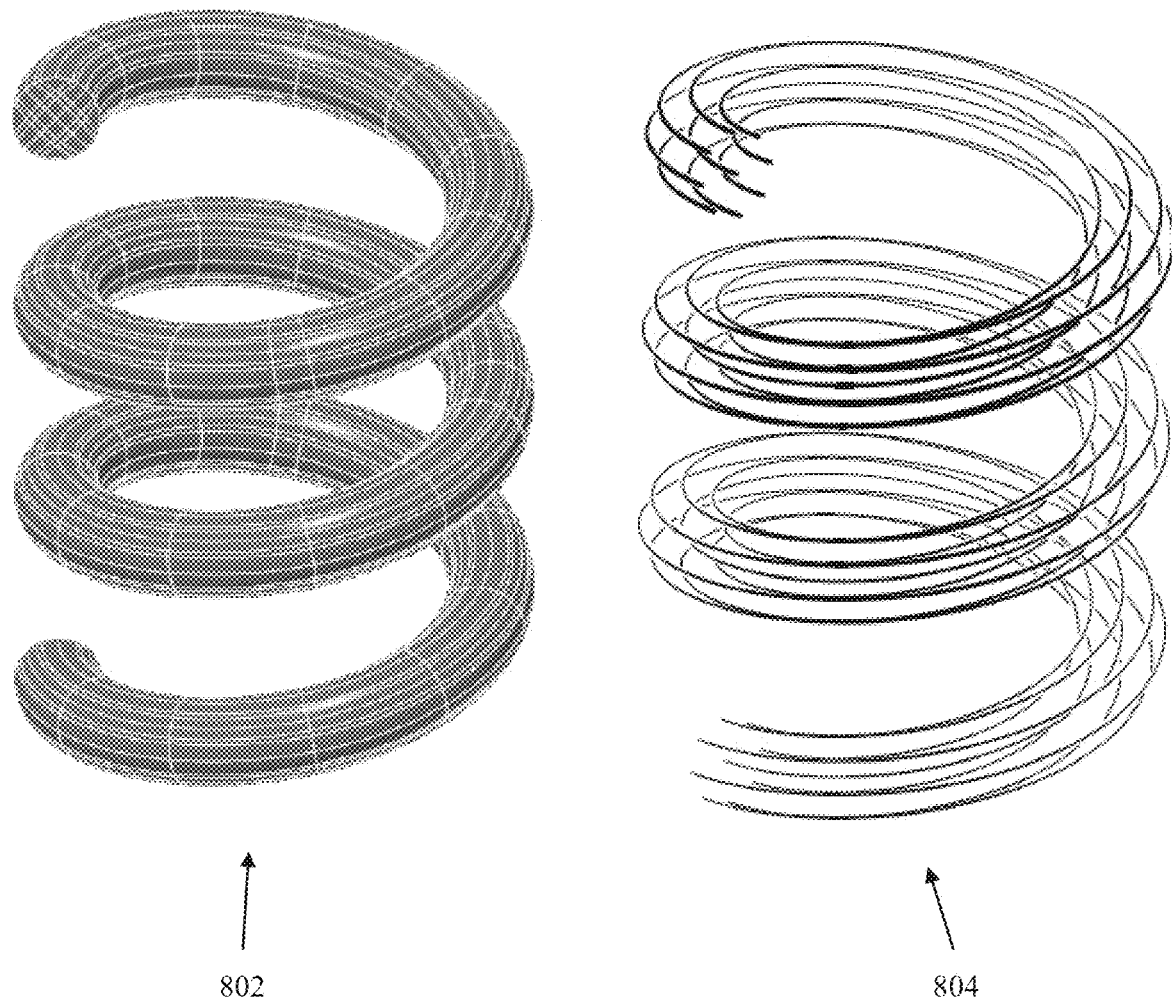
FIG. 8 is a schematic depicting an example of a helical 3D object and a set of univariate curves created using the systems and/or methods described herein, in accordance with some embodiments of the present invention.

Reference is now made to FIG. 8, which is a schematic depicting an example of a helical object 802 (i.e., the received 3D geometric object) and a set of nine univariate curves 804 created using the systems and/or methods described herein, in accordance with some embodiments of the present invention. It is noted that the curves of set 804 naturally follow the shape of (the center axis of) a helix. Using set 804 as tool-paths to manufacturing the helix (e.g., using AM, or computer numerical control (CNC)) creates a physical object with improved mechanical strength and/or improved surface finish, for example, compared to slicing based print-paths that are parallel to the XY plane perpendicular to the printing head).

It is noted that the curves of the 3D object are not necessarily limited to the parameterization in which the 3D geometric object is given if at all defined. In cases where a more general set of covering curves is needed, an external directional vector field that enclosed the 3D object may be defined to provide desired directions of the covering curves. For example and in addition, other external fields may prescribe attributes of the physically manufactured object, for example, color, transparency, desired materials' composition, mechanical strength and/or surface finish. The systems and/or methods described herein may operate using the directional vector field (that encompasses the entire geometry or part thereof), to compute the set of curves for the 3D geometric object that conform to the prescribed external vector field (e.g., directions). The directional field may optionally be a (possibly trimmed) trivariate.

Reference is now made to FIG. 1B, which provides additional detail and/or additional features to the method discussed with reference to FIG. 1A.

At 102, the definition of the 3D geometric object is received, as discussed with reference to FIG. 1A.

Optionally, the received 3D geometric object may be a trimmed trivariate volume. Trimmed trivariate volumes are defined similarly to trimmed surfaces, for example, as a trivariate function with a domain that is a subset of the box domain of the tensor product volume, as described with reference to Elaine Cohen, Richard F Riesenfeld, and Gershon Elber. *Geometric modeling with splines: an introduction*. A K Peters, Ltd., 2001, or as described with reference in Fady Massarwi and Gershon Elber. A B-spline based framework for volumetric object modeling. Computer Aided Design, Vol 78, pp 36-47, September 2016.

Figure 9:
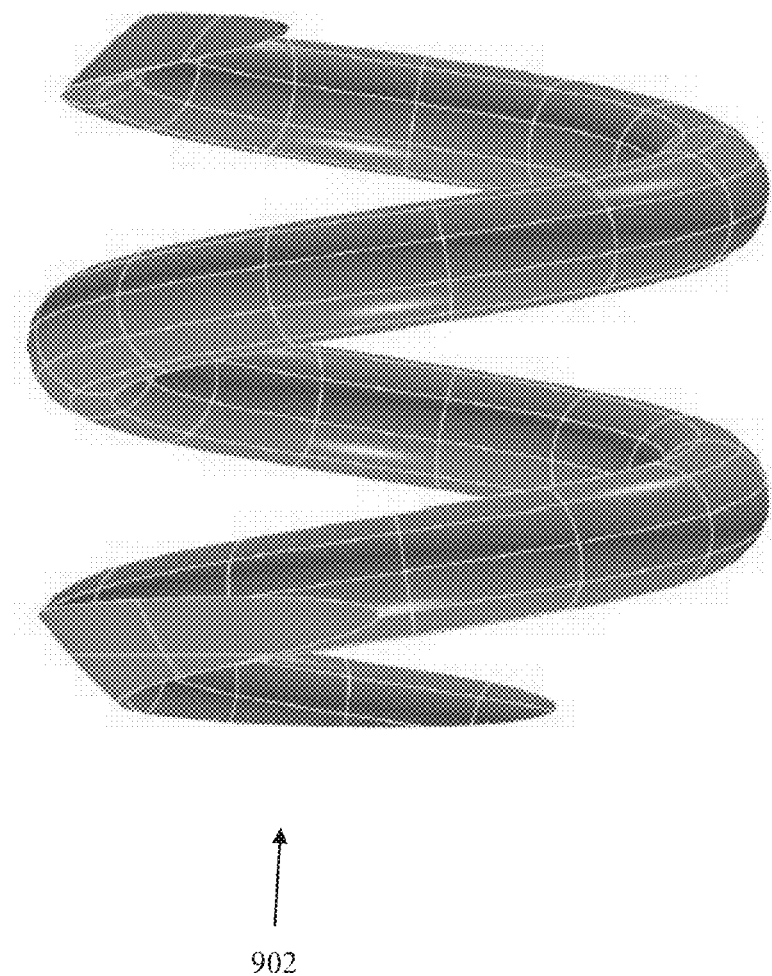
FIG. 9 is a schematic of an exemplary trimmed helical trivariate volume that is created by intersecting the trivariate helix of FIG. 8 with a trivariate sphere, in accordance with some embodiments of the present invention.

Reference is now made to FIG. 9, which is a schematic of an exemplary trimmed helical volume 902 that is created by intersecting helix 802 of FIG. 8 with a sphere, in accordance with some embodiments of the present invention. The set of curves may be computed for volume 902 using the systems and/or methods described herein.

Additional examples and details with respect to trimmed trivariates are found, for example, with reference to Fady Massarwi and Gershon Elber. A B-spline based framework for volumetric object modeling. Computer Aided Design, Vol 78, pp 36-47, September 2016.

Referring now back to block 102 of FIG. 1B, Optionally, an external directional vector field is defined, for example, manually entered by a user, based on a predefined stored configuration, encoded as part of the 3D geometric object, and/or automatically calculated by analysis code. The calculation of surfaces and/or calculation of univariate curves (as described herein) is performed according to the external directional vector field to create the set of univariate curves.

The external vector field, parameterization(s), and/or other defined design goals may be applied to the created set of curves, providing a generality to the method described herein. As used herein, the term design streamlines, or streamlines, of the received geometric 3D object, denote the directions of the curves that cover the volume enclosed by the 3D geometric object, V, based on a set of design goals. The coverage of the curves of the received 3D geometric object (as described herein) may be considered the design streamlines of the received 3D geometric object with regards to the design goal(s). Exemplary representation of the external/additional vector field and/or the parameterization (e.g., exemplary design goals) include: a surface finish, mechanical strength, color, transparency, material property and/or the directional field of the covering curves (the streamlines). The external vector field and/or parameterization create the set of curves that are streamlines of the received 3D object with respect to the design goals, without necessarily requirement modification to the covering method and/or system described herein.

At 108, a set of univariate curves is computed for the 3D geometric object, within the tolerance requirement. The univariate curves may be computed using one or more of the exemplary methods described with reference to blocks 109A-109D.

Optionally, at block 109A, for a (possibly trimmed) trivariates' 3D geometric object, the covering set of univariate curves may be computed for (possibly trimmed) trivariates using intermediate bivariate parametric (possibly trimmed) surfaces that cover the 3D geometric (possibly trimmed) trivariate, within the tolerance requirement. Each of the computed surfaces is then fitted with univariate curve(s).

In terms of formal mathematic representation, and when the 3D geometric object is a (possibly trimmed) trivariate, the parametric trivariate volume be denoted as $V(u,v,w):D \to \mathbb{R}^3$, where D is a box domain in $\mathbb{R}^3$. The desired tolerance (i.e., tolerance requirement) is denoted as $\varepsilon \in \mathbb{R}$. A valid curve covering of V is denoted by a set of n univariate parametric curves $C=\{C_1(t) \ldots C_n(t)\}$, so that for any point $p_v \in V(u,v,w)$ there exists a point $p_c \in C_i(t)$, $C_i(t) \in C$, for which $\|p_c-p_v\| \le \varepsilon$.

The valid surface coverage of the parametric trivariate volume V may be mathematically represented as a set of m bivariate parametric surfaces $S=\{S_1(u,v) \ldots S_m(u,v)\}$, so that for any point $p_v \in V(u,v,w)$ there exists a point $p_s \in S_i(u,v)$, $S_i(u,v) \in S$, for which $\|p_s-p_v\| \le \varepsilon$.

An upper bound on the Hausdorff distance between two adjacent surfaces, that is based on an iso-distance notion may be defined. In terms of mathematical representation, a vector field may be defined for two parametric surfaces $S_1(u,v)$ and $S_2(u,v)$, sharing a common (u,v) domain, as $D(u,v):=S_1(u,v)-S_2(u,v)$. The iso-distance between $S_1$ and $S_2$ may be defined as $\Delta_{iso}(u,v):=\|D(u,v)\|$. Since $\Delta_{iso}(u,v)$ is non-rational (due to the square root), $\Delta^2_{iso}(u,v)$ (the iso-distance squared) is used instead. The Hausdorff distance between two surfaces $S_1$ and $S_2$ may be represented as $d_H$, and denoted by:

$$d_H(S_1, S_2) = \max\{\sup_{a \in S_1} \inf_{b \in S_2} \|a - b\|, \sup_{p \in S_2} \inf_{q \in S_1} \|p - q\|\}$$

A one sided point-surface Hausdorff distance may be denoted as:

$$d_{Hs}(a \in S_1, S_2) = \inf_{b \in S_2} \|a - b\|$$

The iso-distance $\Delta_{iso}(u_0,v_0)$ for a pair of points denotes as $a=S_1(u_0,v_0)$, $b=S_2(u_0,v_0)$ is an upper bound on the one sided point-surface Hausdorff distance of both points $d_H(a \in S_1, S_2)$, $d_H(b \in S_2, S_1)$.

Computation of $\Delta^2_{iso}(u,v)$ may be more efficient (e.g., in terms of computation time, memory resources, and/or processing resources) than computation of the Hausdorff distances.

Reference is now made to FIG. 3, which is pseudo code of a method for covering a, optionally trimmed, trivariate volume (i.e., V) using iso-parametric surfaces of V, using $\Delta^2_{iso}(u,v)$, in the w direction, in accordance with some embodiments of the present invention. Then, for each iso-parametric surface, the iso-parametric curves are extracted following the described method to cover a surface, as described with reference to Gershon Elber and Elaine Cohen. Adaptive isocurve-based rendering for freeform surfaces. *ACM Transactions on Graphics (TOG)*, 15(3):249-263, 1996, extended to also handle trimmed surfaces.

When $\Delta^2_{iso}(u,v)$ is computed (line 4), a determination is made if another surface is required between the two extreme surface to get a valid coverage. When $\Delta^2_{iso}(u,v) < \varepsilon^2$, $\forall(u,v)$, no additional surfaces are added in between, and the method terminates. When $\Delta^2_{iso}(u,v) > \varepsilon^2$ for some (u,v) values, then a trimmed surface (line 12) is introduced. The trimmed surface is added between the two surfaces to satisfy the tolerance requirement when the distance metric between the two surfaces does not satisfy the tolerance requirement.

The trimmed surface is sized and positioned between the two surfaces according to where the distance metric between the two surfaces does not satisfy the tolerance requirement, so that the insertion of the trimmed surface does satisfy the tolerance requirement (or otherwise the process continues recursively). The tensor product surface $S_{mid}(u,v)=V(u,v,w_{mid})$ is trimmed to include (u,v) for which $\Delta^2_{iso}(u,v) > \varepsilon^2$.

When a middle surface is introduced, then the method is invoked recursively for the newly created pair of adjacent surfaces $(w_{low}, w_{mid})$ and $(w_{mid}, w_{high})$ to further verity that the volume between them is covered.

When a valid coverage of V by surfaces is obtained (e.g., according to the valid surface coverage described herein, and/or using the method of FIG. 3), a curve coverage is created by covering each surface with curves.

Each of the surfaces is fitted with one or more univariate curves to create a covering set of univariate curves to the surface.

The coverage of the surface using curves may be implemented based on the method described with reference to FIG. 3, using curves in place of the surfaces, starting with two surface boundary curves and recursively adding interior curves as to satisfy the tolerance requirement.

Figure 4:
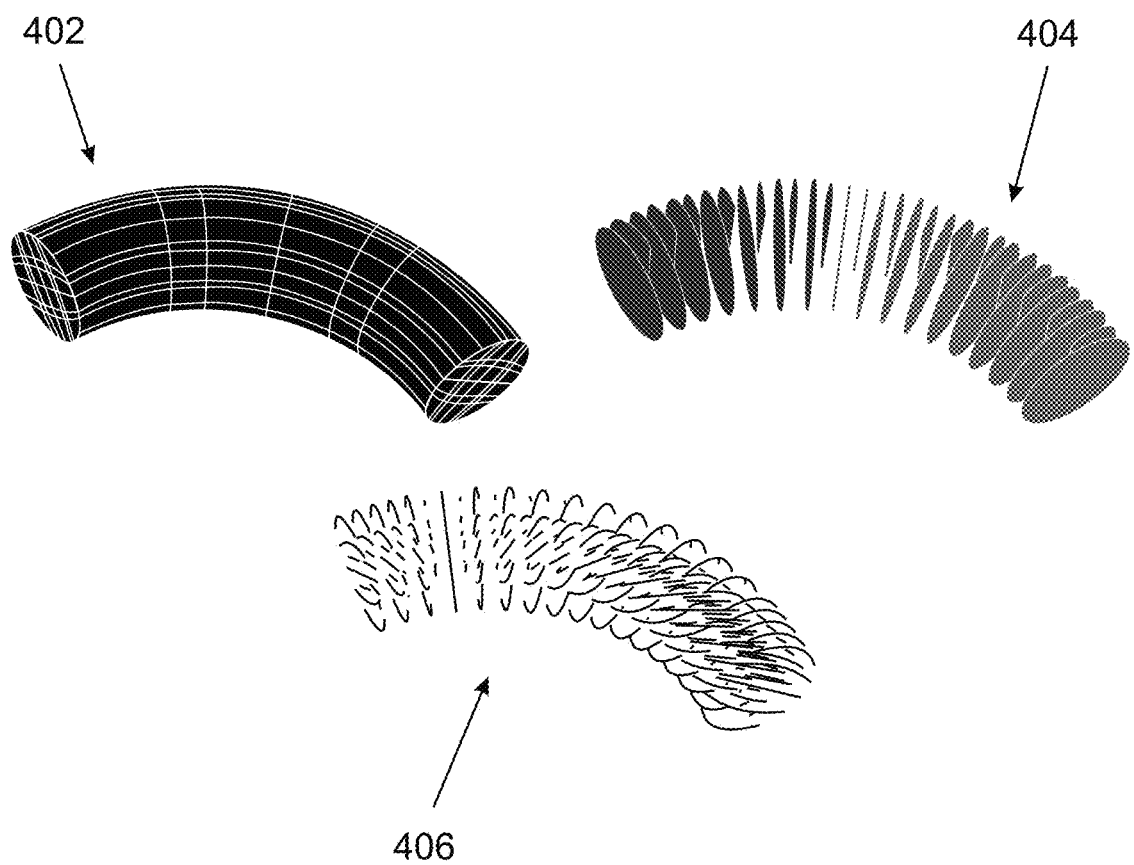
FIG. 4 is a schematic depicting the process of starting with a volume, covering the volume with surfaces, and fitting curves to the surfaces, in accordance with some embodiments of the present invention.

Reference is now made to FIG. 4, which is a schematic depicting the process of starting with a volume V(of a quarter of a torus with major radius 1 and minor radius 0.2) 402, covering V with surfaces 404, and fitting curves 406 to the surfaces, in accordance with some embodiments of the present invention. It is noted that schematic 404 depicts alternating full and trimmed surfaces, based on the method of inserting additional trimmed surfaces between full surfaces described with reference to FIG. 3.

Figure 5:
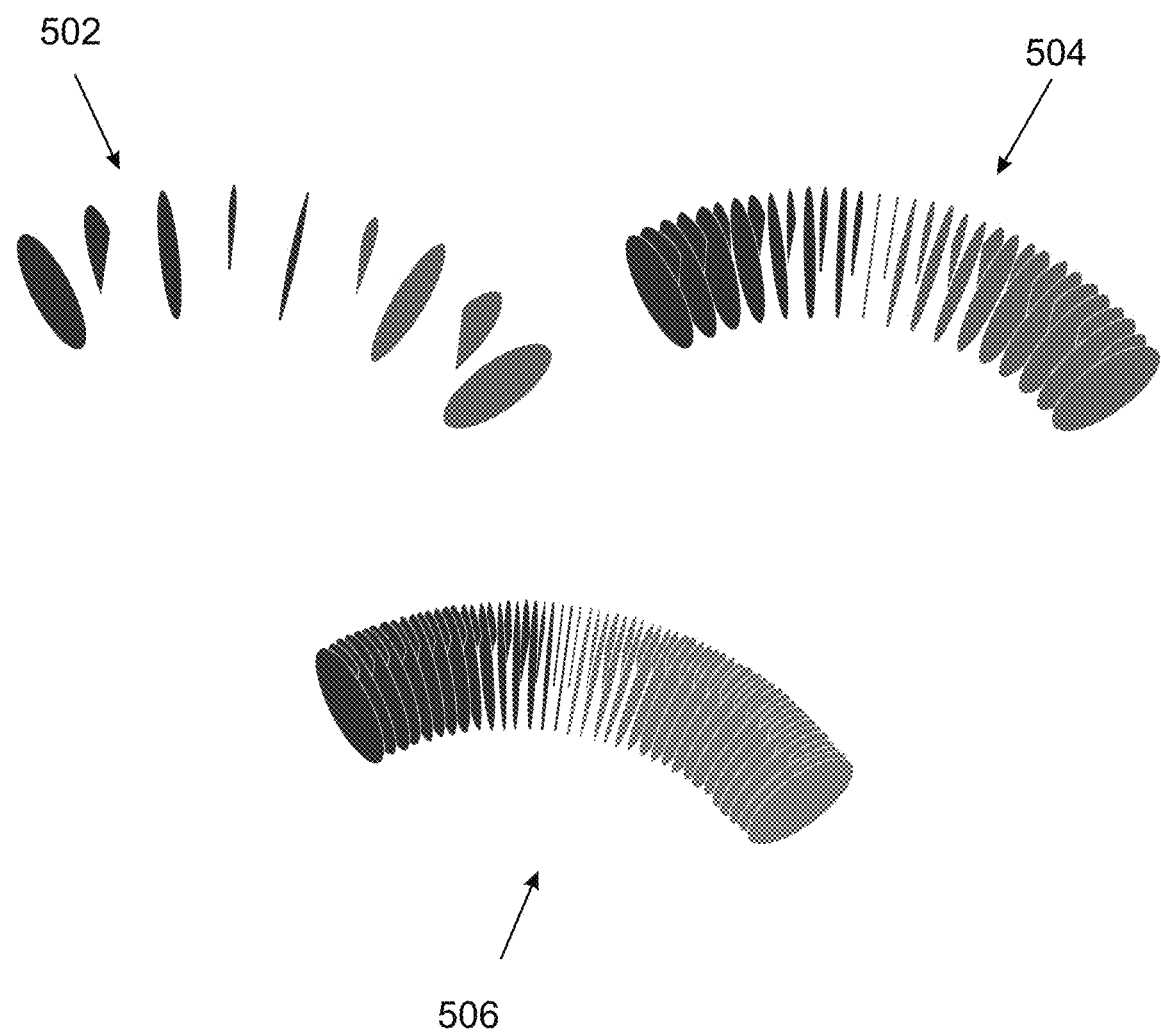
FIG. 5 is a schematic that depicts a coverage of a trivariate volume covered by surfaces with different values of the tolerance requirement, in accordance with some embodiments of the present invention.

Reference is now made to FIG. 5, which is a schematic that depicts a coverage of a trivariate volume V(u,v,w) (of a quarter of a torus with major radius 1 and minor radius 0.2) covered by surfaces with different values of the tolerance requirement ($\varepsilon$), in accordance with some embodiments of the present invention. Schematic 502 includes surfaces for $\varepsilon$=0.4. Schematic 504 includes surfaces for $\varepsilon$=0.1. Schematic 506 includes surfaces for $\varepsilon$=0.05.

The surface coverage is calculated using the method described with reference to FIG. 3. It is noted that m (of the method described with reference to FIG. 3) is defined to ensure a minimal depth of recursive calls, for example, in case V(u,v,w) is a periodic trivariate (e.g., a full torus), where $V(u,v,w_{min})=V(u,v,w_{max})$. If $\Delta^2_{iso}(u,v)<\varepsilon^2$, then any point on the line between $V(u_0,v_0,w_{low})$ and $V(u_0,v_0,w_{high})$ is covered as its distance to one of these surface points is less than $\varepsilon$ (in fact less than $\varepsilon/2$). However, $\Delta^2_{iso}<\varepsilon^2$ for any (u,v) does not imply that all points in the volume $V(u,v,w_r)$, $w_r \in (w_{low}, w_{high})$ are covered. If some point $p_w$ on the parametric curve $V(u_0,v_0,w_r)$ is sufficiently far from the line between $V(u_0,v_0,w_{low})$ and $V(u_0,v_0,w_{high})$ it is possible that $p_w$ remains uncovered.

Figure 6:
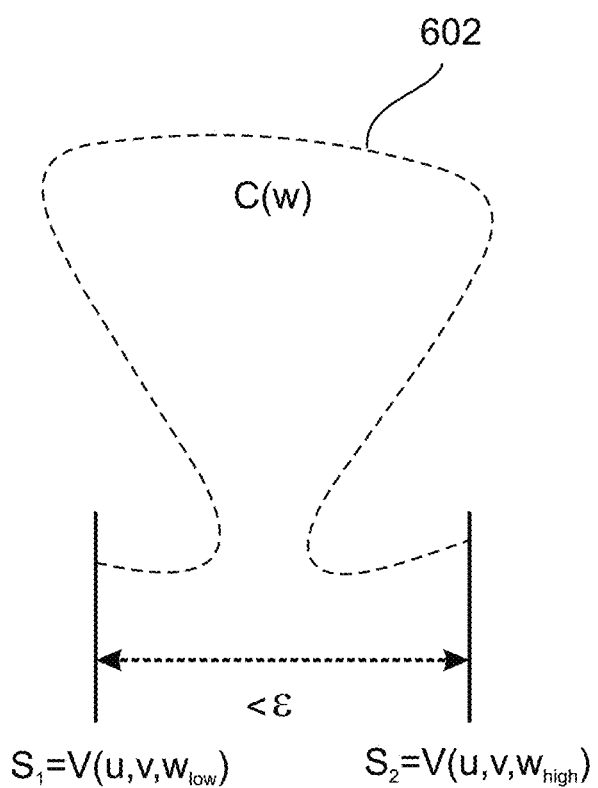
FIG. 6 is a schematic that depicts an example of a situation in which two surfaces are close together, but the volume in between the surfaces includes points that are too far from both surfaces, in accordance with some embodiments of the present invention.

Reference is now made to FIG. 6, which is a schematic that depicts an example of a situation in which $S_1=V(u_0,v_0,w_{low})$ and $S_2=V(u_0,v_0,w_{high})$ are close together, and satisfy tolerance requirement $\varepsilon$ (i.e., less than $\varepsilon$), but the volume in between the surfaces includes points (along a w iso-parametric curve 602 between the surfaces) that are too far from both surfaces, in accordance with some embodiments of the present invention.

Referring now back to FIG. 1, at 109A, an optional check is performed that the set of computed curves and/or computed surfaces satisfy the tolerance requirement. The check includes verification that points on the fitted curves (optionally all points on all curves) satisfy the tolerance requirement.

The check may be performed after computation of the respective curves, and/or simultaneously with computation of each curve, and/or at other events during the process.

An error of correctly determining the iso-distance measure is potentially problematic especially on the boundaries. Different methods are described herein to solve this technical problem of an invalid coverage (e.g., for B-spline and Bezier volumes), by augmenting and/or replacing the bound of $\Delta^2_{iso}$ with the check of whether or not iso-surfaces $V(u,v,w_{low})$ and $V(u,v,w_{high})$ are a valid coverage of the convex hull of the control mesh of $V(u,v,w_r)$, $w_r \in (w_{low}, w_{high})$ that contains V (optionally represented as a Bezier or B-spline).

A valid coverage of the convex hull of the control mesh of the set of univariate curves that fill the volume of the 3D geometric object between the two surfaces is provided.

In terms of mathematical representation, for CH(V) denoting the convex hull of the control mesh of (optionally a B-spline or a Bezier) volume V(u,v,w), $w \in [w_{min}, w_{max}]$. When every point $p_h \in CH(V)$ is covered by surfaces $V(u,v,w_{min})$ and $V(u,v,w_{max})$, then V(u,v,w) is covered by $V(u,v,w_{min})$ and $V(u,v,w_{max})$.

Checking that the surfaces cover the convex hull may be performed, for example, by dividing the trivariate volume (or portion thereof) into two (e.g., by splitting at $w_{mid}$) and checking that the convex hull of the control mesh (of each of the split sub-volumes) is covered by the corresponding surface. For non-singular volumes, the check may be performed by checking the convex hull of the control meshes of the six bounding surfaces (or five since one is the covering surface itself).

Other exemplary methods to ensure complete coverage may include by bounding the length of the univariate (e.g., iso-parametric) curves. The bounding is according to the tolerance requirement between the two surfaces corresponding to each curve. For example, given an iso-parametric curve from one covering surface to another, if the arc length of the curve is less than $2\varepsilon$ then full coverage is assured for all points on the line. Examining such bounds for all lines (through their control poly-lines) may be used to ensure complete volume coverage.

Optionally, a check is performed to identify over-coverage of a region. The over-coverage check may be performed by checking that corresponding points on the surfaces within the region are considered closer than they actually are when the two surfaces are skewed relative to one another above a skewing requirement. Checking for coverage of the convex hull may provide a tighter bound on the Hausdorff distance than $\Delta^2_{iso}(u,v)$.

Another exemplary method to prevent over-coverage is based on using a different measure of distance than the iso-distance (i.e., $\Delta^2_{iso}(u,v)$ described with reference to FIG. 3). For example, in order to account for the relative orientation of two surfaces (or curves), the following may be defined:

$$\Delta_{iso}^{new}(u,v) := \frac{\|(D(u,v), (n_1(u,v)+n_2(u,v)))\|^2}{\|(n_1(u,v)+n_2(u,v))\|^2}$$

Where $n_1(u,v)$ and $n_2(u,v)$ are the unit normal fields of the surfaces accounting for the relative skewing between the two surfaces. Using the above (rational) measure, corresponding points on the two surfaces that differ much in direction, with respect to the surface normals, are considered closer than they are, the logic being that other points (with other (u,v) values) on the other surface are closer.

Figure 7:
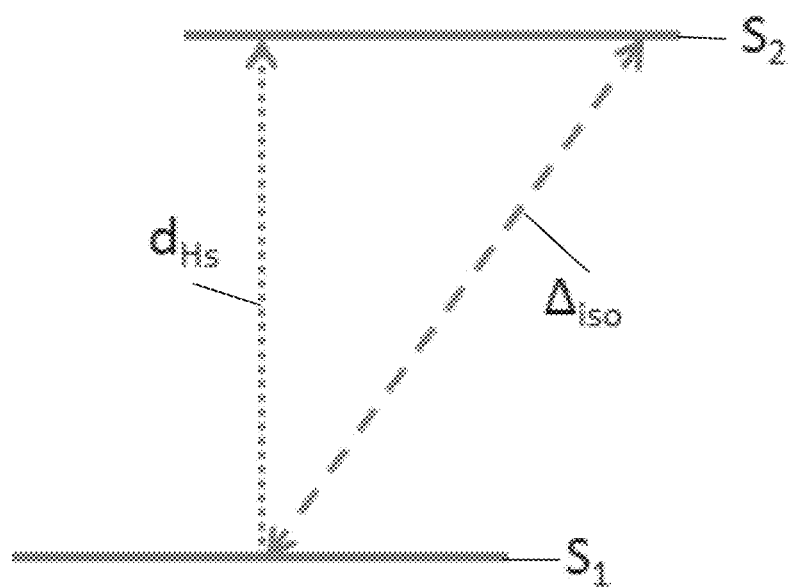
FIG. 7 is a schematic where a new distance measure may work better than an overly conservative measure, in accordance with some embodiments of the present invention.

Reference is now made to FIG. 7, which is a schematic of an example where a new measure may work better than the $\Delta^2_{iso}$ measure described herein (which may be overly conservative), in accordance with some embodiments of the present invention. As shown in FIG. 7, for surfaces $S_1$ and $S_2$, the iso-distance $\Delta_{iso}$ may be arbitrarily larger than the one sided Hausdorff distance $d_{Hs}$.

It is noted that the $\Delta_{iso}^{new}(u,v)$ measure no longer bounds from above the Hausdorff distance, and may yield a non-valid coverage in some cases.

Referring now back to FIG. 1B, alternatively or additionally, at 109B the volume enclosed by a 3D object representation may be divided into multiple discrete cells on a 3D grid, optionally using dexel (depth cells), with reference to Real-time shaded NC milling display, Tim Van Hook, ACM SIGGRAPH Computer Graphics, Volume 20 Issue 4, August 1986, Pages 15-20.

Optionally, all accessible cells (those without any other cell below them) are uniquely covered by curves and removed from the 3D, a process that continues until no more uncovered cells remain. Optionally, each cell is covered by curve(s) by tracing a freeform curve from the center (or other location) of each respective discrete cell, optionally following a direction according to the external vector field. The freeform curve tracing terminates when another covered discrete cells is encountered, or when the freeform curve leaves the volume prescribed by the respective discrete cell. The created set of curves covers the 3D object according to the tolerance requirement ($\varepsilon$) with bounded redundancy, and optionally following the external direction (i.e., vector) field.

Alternatively or additionally, at 109C, when the external vector field (e.g., direction field) is defined, exemplary methods for computing the curves to cover the trivariate volume may be implemented. The directional field is optionally prescribed by an external trivariate volume that encloses the given 3D geometric object. In such a case, the covering curves follow the external trivariate volume when the covering set of univariate curves is created, optionally spread uniformly or optionally using the systems and/or methods described herein with reference to the trivariate parametric volume. The created set of univariate curves of the external field are clipped to fit inside the given 3D geometric object. Computation of the intersections of the covering curves with the 3D geometric object, toward the clipping, may be performed algebraically, by computing the intersection of covering curve $C(t)=(C_x(t), C_y(t), C_z(t))$ and the 3D geometric object's boundary surface $S(u,v)=(S_x(u,v), S_y(u,v), S_z(u,v))$, and solving for: $C_x(t)=S_x(u,v)$, $C_y(t)=S_y(u,v)$, $C_z(t)=S_z(u,v)$, or using (e.g., piecewise linear, and/or piecewise constant) approximations of the boundary and the curve and computing the intersections using the approximations.

Figure 10:
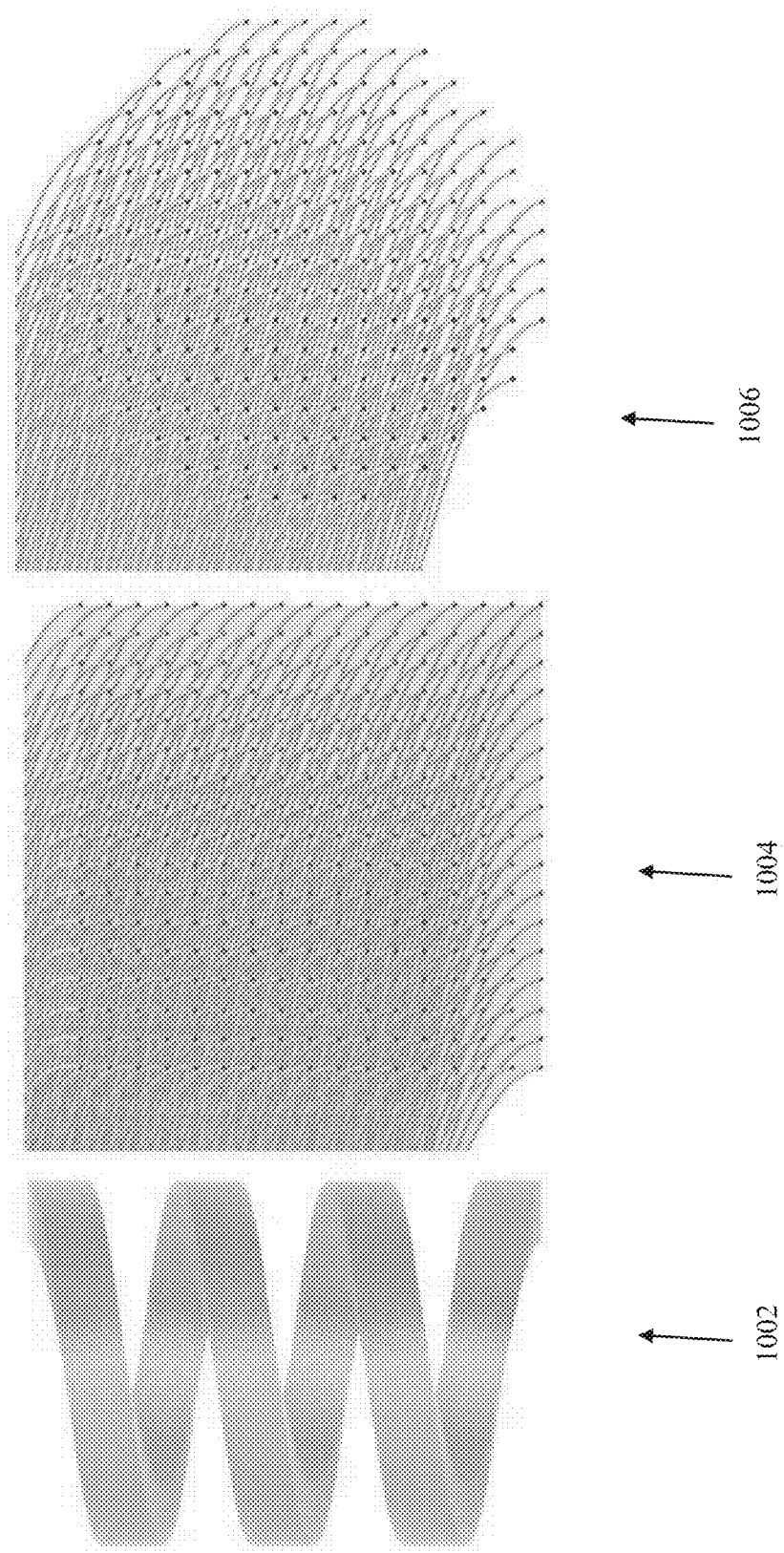
FIG. 10 is a schematic depicting the process of clipping the set of curves according to an external vector field, in accordance with some embodiments of the present invention.

Reference is now made to FIG. 10, which is a schematic depicting the process of clipping the set of curves according to an external vector field, in accordance with some embodiments of the present invention. Image 1002 depicts the set of curves uniformly spread in an external helix trivariate directional field with a square cross sectional shape that is to be clipped. Image 1004 is a zoom-in of the bottom of the square helix of image 1002. Image 1006 depicts the result of clipping the set of curves for the square helix directional field to include the curves that fit inside the helix with a circular cross section.

The external direction field may be used to achieve covering curves with control over the uniformity of the distribution, or controlling other properties in the covering, including obviously the directions of the curves.

Figure 19:
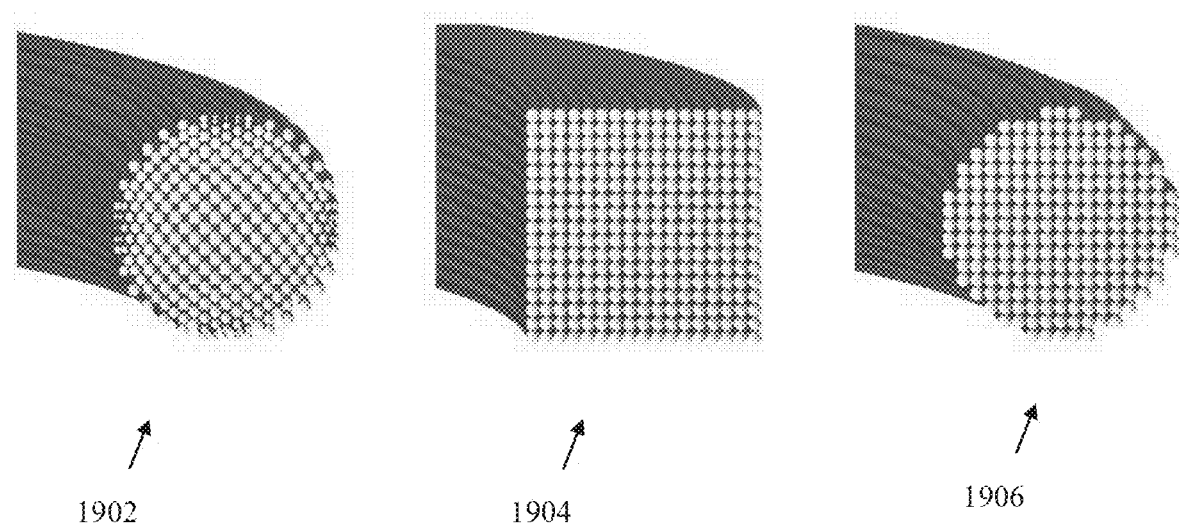
FIG. 19 includes schematics depicting the differences between the computed covering set of curves for a 3D object represented using a trivariate and the covering set of curves computed using the external vector field and clipping for a general 3D object, in accordance with some embodiments of the present invention.

Reference is now made to FIG. 19, which includes schematics depicting the differences between the computed set of covering curves using the original parameterization of a 3D trivariate object and the set of covering curves computed using an external vector field and clipping, in accordance with some embodiments of the present invention. FIG. 19 shows zoom-in portions of the end of the set of curves computed for a helix 3D geometric object using an external trivariate direction field (i.e., external vector field) and/or created by clipping. Set of curves 1902 are created using the original parameterization defined by the received 3D trivariate object. Each tube represents the radius of the respective curve. Set of curves 1904 are created using an external direction field that defines a square cross profile for the helix instead of the circle profile. Set of curves 1906 are created by clipping set of curves 1904 created using the external direction field to fit the original received 3D geometric object.

Referring now back to FIG. 1B, alternatively or additionally, at 109D the set of curves may be created using function composition (e.g., curve-trivariate function composition) to map the computed curves into Euclidean space. The computed curves are thereby not necessarily limited to the original parameterization. In terms of mathematical representation, $C(t)=(u(t), v(t), w(t))$ denotes a curve in the domain of trivariate $T(u,v,w)$. $T(C)=T(u(t), v(t), w(t))$ denotes a curve in the Euclidean space. The set of curves may be computed by placing curves in the domain of T, with density that may compensate for T being non-isometric.

Figure 11:
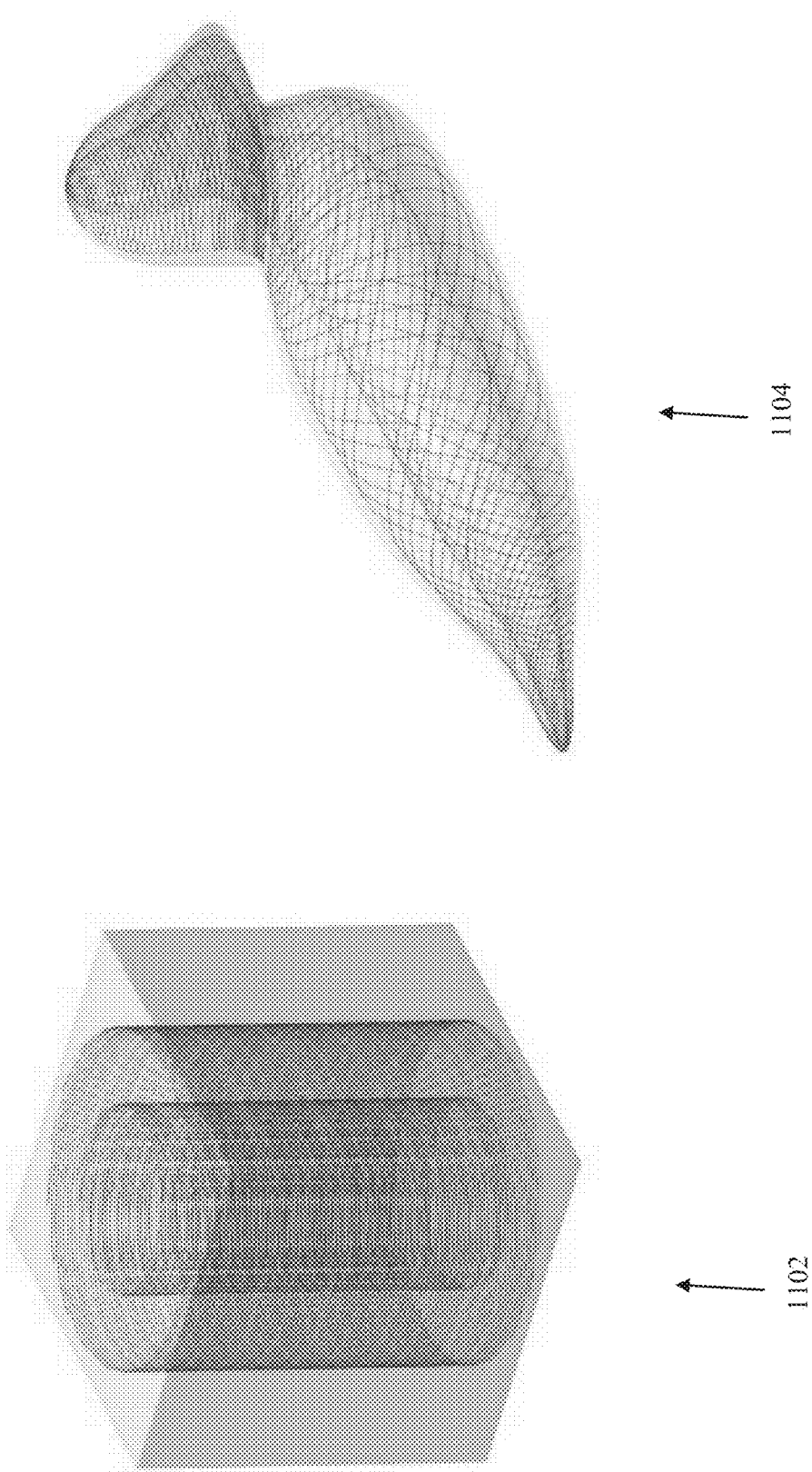
FIG. 11 includes schematics depicting the process of mapping curves into Euclidean space, in accordance with some embodiments of the present invention.

Reference is now made to FIG. 11, which includes schematics depicting the process of mapping curves into Euclidean space, in accordance with some embodiments of the present invention. Image 1102 depicts the domain (a cube) of the trivariate paved with univariate curves (as two sets of concentric helices). Image 1104 depicts the image of 1102 composed with the trivariate to yield the set of curves in Euclidean space.

Referring now back to FIG. 1B, at 112, the set of univariate curves are ordered for printing by a 3D printing head using material deposition along each curve-member of the set of univariate curves. The ordering is selected such that during the 3D printing process curves that are not yet printed may be printed when such curves have no unprinted curves below.

The curves are ordered for printing to provide a technical solution related to the technical problem of 3D printing a set of 3-space curves in general 3D positions. At any point during the 3D-printing process, some parts of the 3D model are already printed, while other parts are waiting to be printed. The printing head of the 3D printer has a certain geometry that occupies a corresponding physical space. When the printing head is unable to print the unprinted portion of the 3D model, without the printing head penetrating (i.e., cutting into) an already printed part, then the printing process cannot succeed. Either an unprinted part will never be printed, or an already printed part will be gouged into and destroyed by the printing head.

The technical printing problem arises when printing curves general 3D curves, in comparison to traditional slicing methods, in which the geometry of the printing head may be assumed to occupy the half-space above a plane parallel to the XY plane of the curves currently being printed. The printing head is consistently at a certain offset (in the z axis direction) above the currently printed part. Since parts are printed in planes parallel to the XY plane, from bottom to top, no penetration of the printed parts by (the geometry of) the printing head occurs, in slicing based 3D printing. The ordering of the curves of the set of univariate curves, one complete slice after another, ensures that the print-paths followed by the printing head do not result in gouging of already printed parts.

Going back to the full 3D printing of general univariate curves proposed herein, in terms of mathematical representation, a curve $C_i$ is below curve $C_j$ and denoted $C_i<C_j$, if the geometry of the printing head overlaps with curve $C_j$ when printing curve $C_i$. Symmetrically, curve $C_i$ is above $C_j$ if $C_j$ is below $C_i$. At any point in time during the 3D printing process, only the curves that are not yet printed and have no unprinted curves below them may be printed.

Optionally, the order is defined according to a computed a directed graph that stores the possible valid ordering(s) for printing the curve-members of the set of univariate curves. Each curve-member is assigned to a vertex of the directed graph. A directed edge between two vertexes of the graph is defined when a first of the two vertexes is below a second of the two vertexes relative to the 3D printing head. When the directed graph is acyclic the directed graph represents one or more valid 3D printable ordering(s) of the set of univariate curves. It is noted that different valid orderings may be represented by a common graph.

Optionally, the directed graph stores the ordering of printing the set of univariate curves, where each curve-member is assigned to a vertex of the directed graph, and a directed edge between two vertexes exists when a first of the two vertexes is below a second of the two vertexes relative to the 3D printing head, in 5-axis additive manufacturing 3D printing, at least in some printing head orientations. When the directed graph is acyclic the directed graph represents a 3D printable ordering of the set of univariate curves.

In terms of mathematical representation, the directed graph denoted as $G_a(V,E)$ is created for a set of n curves $C=\{C_1(t) \ldots C_n(t)\}$ by: assigning each curve $C_i \in C$ to a vertex $v_i \in V$. A directed edge $e_{ij} \in E$, from $v_i$ to $v_j$, exists if $C_i < C_j$. $G_a$ denotes the accessibility graph for C. A cycle in the graph $G_a$ is sometimes termed herein an inaccessibility cycle, representing an impossible-to-print set of curves. C represents a non-gouging printable set of curves if and only if $G_a$ is acyclic.

$G_a$ defines the set of possible correct printing orders for a set of curves. When a path exists from $v_i$ to $v_j$ in $G_a$, curve $C_i$ must be 3D-printed before curve $C_j$. An inaccessibility cycle indicates that no printing order is found. The 3D-printing process may be realized by subdividing the curves in C into a new set of curves $C_{new}$, that includes an acyclic $G_a$. It is noted that the division may be selected to reduce the number of curves that are subdivided. A continuous printing path (i.e., from non-divided curves) may yield a stronger part than one made up of separate printed elements (i.e., divided curves), for example, as described with reference to Sung-Hoon Ahn, Michael Montero, Dan Odell, Shad Roundy, and Paul K Wright. Anisotropic material properties of fused deposition modeling abs. *Rapid Prototyping Journal*, 8(4):248-257, 2002.

For computing $G_a$ for C, the geometry of the printing head may be provided.

Figure 13:
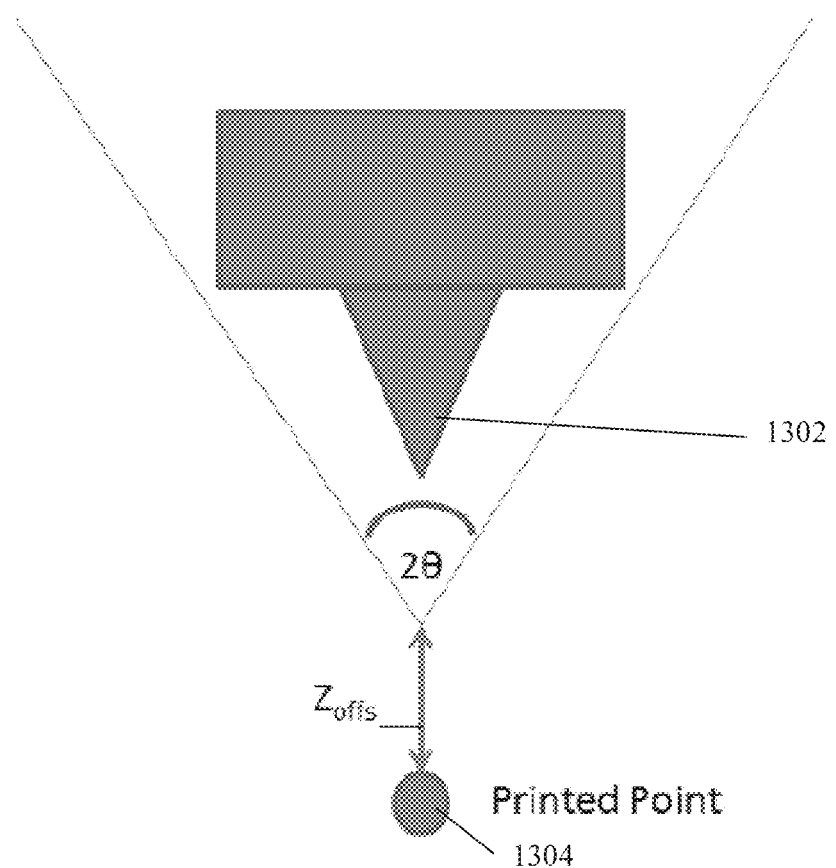
FIG. 13 is a schematic representing the geometry of the printing head used to compute the accessibility and the order of the set of curves, in accordance with some embodiments of the present invention.

Reference is now made to FIG. 13, which is a schematic representing the geometry of the printing head used to compute the order of the set of curves, in accordance with some embodiments of the present invention. The geometry of the printing head may be modeled, for example, as a downward (axis parallel to the z axis) pointing cone 1302. Cone 1302 may be used as a bounding cone for different types of printing heads. The angle of the cone is denoted as θ. The z-offset of the tip of cone 1302 above the currently printed part 1304 denoted as $z_{offs}$, is set to bound the geometry of the actual extruder in use.

To compute when curve $C_i < C_j$, a check may be performed as to whether the volume that encloses the sweep of the cone along curve $C_i$, intersects $C_j$. An intersection indicates that $C_i < C_j$.

Figure 14:
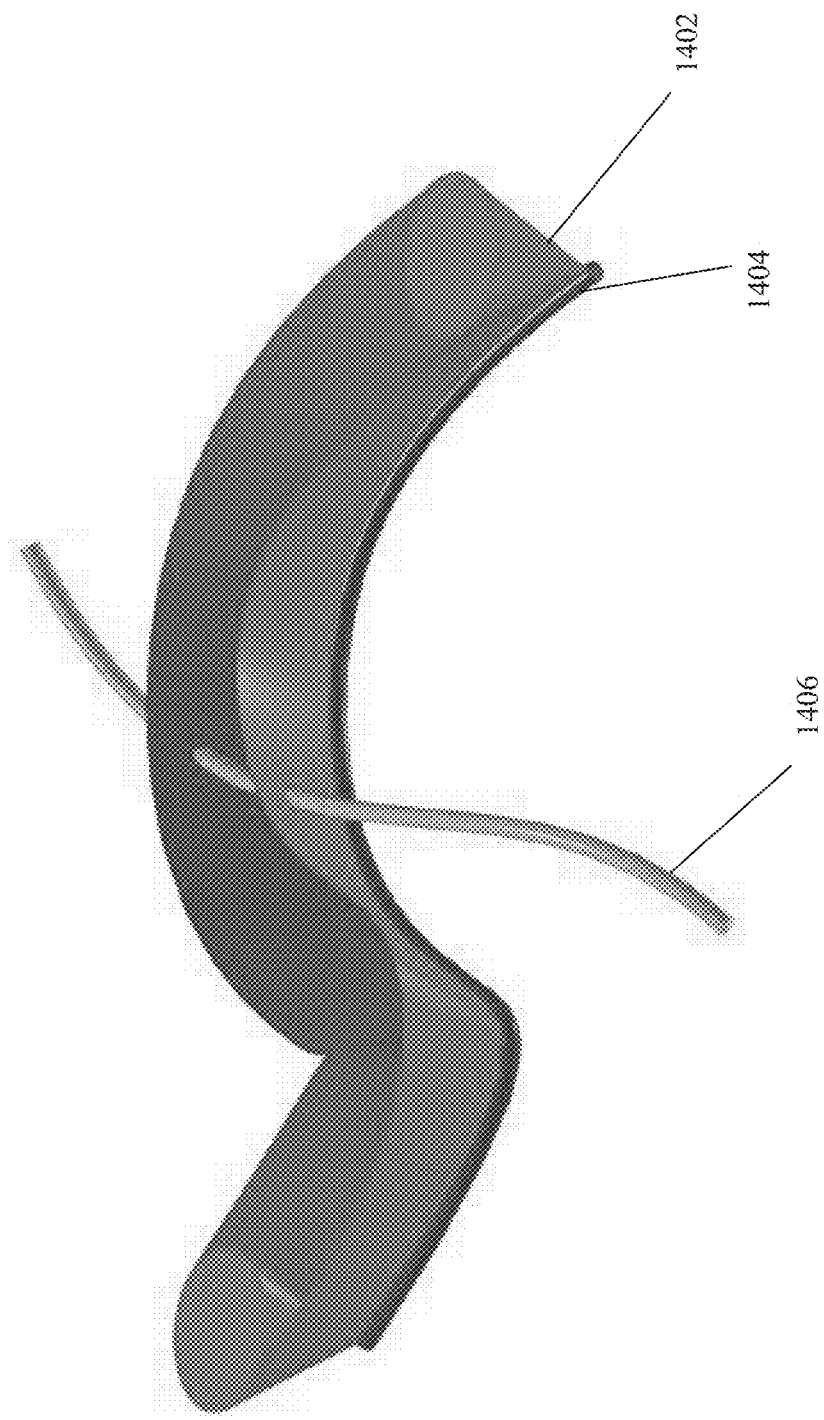
FIG. 14 is a schematic depicting an intersection between a volume defined by a sweep of a cone bounding the printing head during printing of a lower curve, and a portion of an upper curve, in accordance with some embodiments of the present invention.

Reference is now made to FIG. 14, which is a schematic depicting an intersection between a volume 1402 defined by a sweep of a cone bounding the printing head during printing of a lower curve 1404, and a portion of an upper curve 1406, in accordance with some embodiments of the present invention. The intersection indicates that curve 1404 is below curve 1406, and therefore curve 1404 must be printed before curve 1406.

Referring now back to block 112 of FIG. 1B, the check that $C_i < C_j$ may be performed for all pairs of curves in C to construct $G_a$. In terms of computational efficiency, checking each pair of curves is $O(n^2)$. The computational efficiency of computing $G_a$ may be improved by calculating a conservative approximation of $G_a$, denoted herein as $\overline{G}_a$. The conservative approximation may be computed, for example, using spatial division acceleration structures, for example a BVH (bounding volume hierarchy) described with reference to Steven M Rubin and Turner Whitted. A 3-dimensional representation for fast rendering of complex scenes. In *ACM SIGGRAPH Computer Graphics*, volume 14, pages 110-116. ACM, 1980, or a z-buffer, or based on other method. The computation of $\overline{G}_a$ may be performed relatively efficiently once a curve is subdivided into (sufficiently for the acceleration structure) spatially compact sub-curves. For example, a BVH query may be used to find (a conservative approximation of) all sub-curves that are above other sub-curves. The data of which sub-curves are above other sub-curves is used to compute $\overline{G}_a$.

When $\overline{G}_a$ (corresponding to $G_a$) is calculated, an order may be defined based on the valid possible ordering combinations. When $G_a$ is acyclic, any order that concurs with the order imposed by $\overline{G}_a$ may be selected. Additional subdivision of the curves is not necessary. For example, the ordering may be implemented by initially identifying the accessible curves (i.e., that have nothing below them) and adding the identified accessible curves to the printing list (and removing them from $G_a$). Optionally, the 3D printer dynamically prints curves from the list while new curves are added to the list as the new curves become accessible based on the printed curves. When the initial set of curves may be represented as an acyclic $G_a$ the printing process will eventually terminate successfully.

Alternatively, one or more cycles are identified in the directed graph that represents an impossible-to-print subset of univariate curves. The cycle may be removed by dividing one or more of the subset members of univariate curves of the cycle to remove the cycle from the directed graph. The cyclical directed graph is transformed into an acyclic graph by removal of the cycle. Ordering of the curve-members and printing according to the order may proceed as described herein.

The subdivision of the curves may be performed, for example, using a top-down, and/or bottom-up approach to identify where to subdivide the curves. The top-down approach is based on starting with the generated set of curves (as described herein). One or more curves are selectively divided (optionally selected to reduce or minimize the total number of subdivisions performed) and rebuild $\overline{G}_a$ until no cycles remain.

The bottom-up approach is based on starting with the curves subdivided into small sub-curves termed herein fragments. The directed graph is computed by dividing each curve-member of the set of univariate curves into fragments. Each fragment has a length less than a defined fragmentation tolerance, denoted as δ. The fragmentation tolerance may correspond to the physically smallest curve that the printing head is capable of printing, optionally a minimum height of material deposited by the 3D printing head. The fragments are iteratively merged (optionally as pairs of fragments), and/or previously merged fragments (i.e., curves of two or more fragments) may be additionally merged, while maintaining an acyclic directed graph.

In terms of mathematical representation, $\mathcal{L}=\{C_1^l, \ldots, C_k^l\}$ denotes a cycle in directed graph $\overline{G}_a$. $A_l(C_i^l)$ denotes the accumulated arc-length of $C_i^l$ in $\mathcal{L}$. An assumption is made that no cycles made entirely of curves shorter than δ exist. If $\mathcal{L}$ is a cycle, $\forall i\, A_l(C_i^l) > \delta$. It is noted that cycles of curves shorter than δ pose a local inaccessibility difficulty that may be resolved, for example, by expanding the bounding cone of the printing head by δ.

The initial set of fragments are assumed to be representable as a acyclic $\overline{G}_a$. Pairs of fragments (and/or sub-curves created with a previous merger) are merged while maintaining the acyclic $\overline{G}_a$. The merging may be performed selectively to obtain a minimal final number of curves. The minimal final number of curves produces a stronger and/or finer physical product.

Either approach may be shown to be an NP-complete problem (via a reduction from the monotone planar 3-SAT problem described with reference to Mark De Berg and Amirali Khosravi. Optimal binary space partitions for segments in the plane. *International Journal of Computational Geometry & Applications*, 22(03):187-205, 2012. Heuristic methods may be used to further improve the computational efficiency of finding solutions. For the bottom-up approach, the curves are subdivided into small fragments based on the fragmentation tolerance (as described herein) such that each sub-curve is shorter than a predetermined value (e.g., corresponding to a layer height in slicing based AM, and/or the shortest curve that the printer is capable of handling while having cycles of lengths<δ).

A greedy bottom-up approach may be used to merge the fragments according to the following instructions (which are coded into processor executable instructions):

(1) Step 1:
(a) Initialize a list of sub-curves L to an empty list.
(b) Create the fragments by subdividing the initial set of covering curves (until no sub-curve is longer than a given value defined based on the fragmentation tolerance δ), and mark all fragments as unprocessed.
(c) Using the current set of unprocessed fragments, and for each original print-path curve C, find a single group of adjacent fragments from C with no unprocessed fragments below the members of the group (locally checking no edge in the $\overline{G}_a$ is directed at the members of the group), and merge the members of the group into a sub-curve. A heuristic method may be implemented to select the best sub-curve based on the sub-curve with the least amount of endpoints adjacent to unprocessed fragments (i.e., zero, one, or two), and breaking any ties by optionally selecting the longer (in the parametric domain) sub-curve.
(d) Mark all fragments in the selected sub-curve as processed. Add the sub-curve to L.
(e) Go to 1(c) unless no unprocessed fragments remain. The lowest (z value) unprocessed fragment consistently remains a possible choice in 1(c) so the process is bound to eventually terminate.

(2) Step 2:
(a) When possible, merge a single pair of adjacent sub-curves (from the same original curve, C) in L, and update L. Merging is possible when a global check shows the $\overline{G}_a$ graph for the sub-curves resulting from the merge remains acyclic.
(b) Go to 2(a) unless no further merges are possible. Every merge reduces the number of sub-curves by one, so the process is bound to eventually terminate.

The above method produces an ordered list of (sub-)curves that may be 3D printed (e.g., using AM). Steps 1 and 2 merge together sub-curves to create longer sub-curves. Step 1 performs the merging in a local (and computationally more efficient) manner. Step 1 greedily decides the following: assume unprocessed fragments are unprinted, and processed fragments are printed, what would be the best (according to the heuristic method described in step 1(c)) chain of fragments from the same curve to print right now? The best chain is then merged into a sub-curve and marked as processed. Step 1 is iterated until there are no more unprocessed fragments, and fragments (all, or most) have been merged into longer sub-curves. Step 2 resolves a more global question: When merging two sub-curves from the same original curve C, would the resulting set of curves have an acyclic $\overline{G}_a$? When the answer is yes, then merging is performed.

Figure 15:
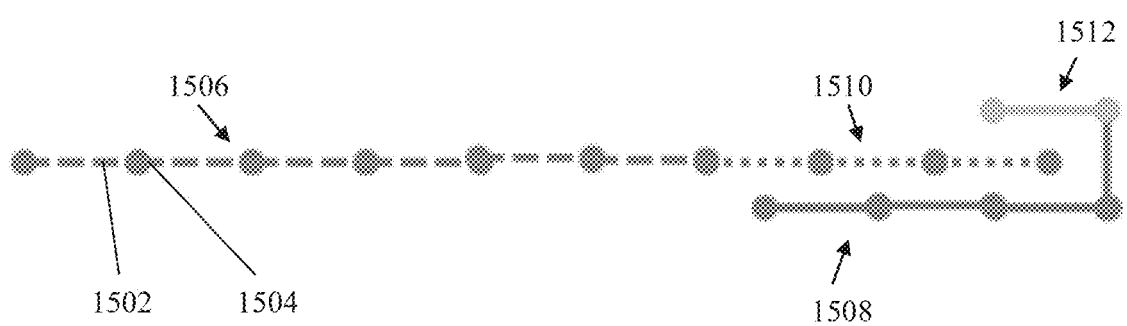
FIG. 15 is a schematic that graphically depicts the process of merging sub-curves (and/or fragments), in accordance with some embodiments of the present invention.

Reference is now made to FIG. 15, which is a schematic that graphically depicts the process of merging sub-curves (and/or fragments), in accordance with some embodiments of the present invention. Based on the above described method, the first time step 1(c) is executed, fragments (represented as lines 1502 between points 1504) are initially merged into sub-curve 1506 (represented by the dashed lines between points). During the second iteration of step 1(c), fragments are merged to create sub-curve 1508 (represented by the solid line between points). During the third iteration of step 1(c), fragments are merged to create sub-curve 1510 (represented by the dotted line between points). During the fourth iteration of step 1(c), fragments are merged to create sub-curve 1512 (represented by the grey solid line between points).

In the second step, sub-curves 1506 and 1510 are merged, since the merged curve (of sub-curves 1506 and 1510) may be printed without creating an inaccessibility cycle. It is noted that step 2 may be performed on the fragments themselves (rather than on the sub-curves created by merging fragments in the previous steps). However, the described method based on a greedy heuristic provides a more computationally efficient process for merging of fragments.

Figure 16:
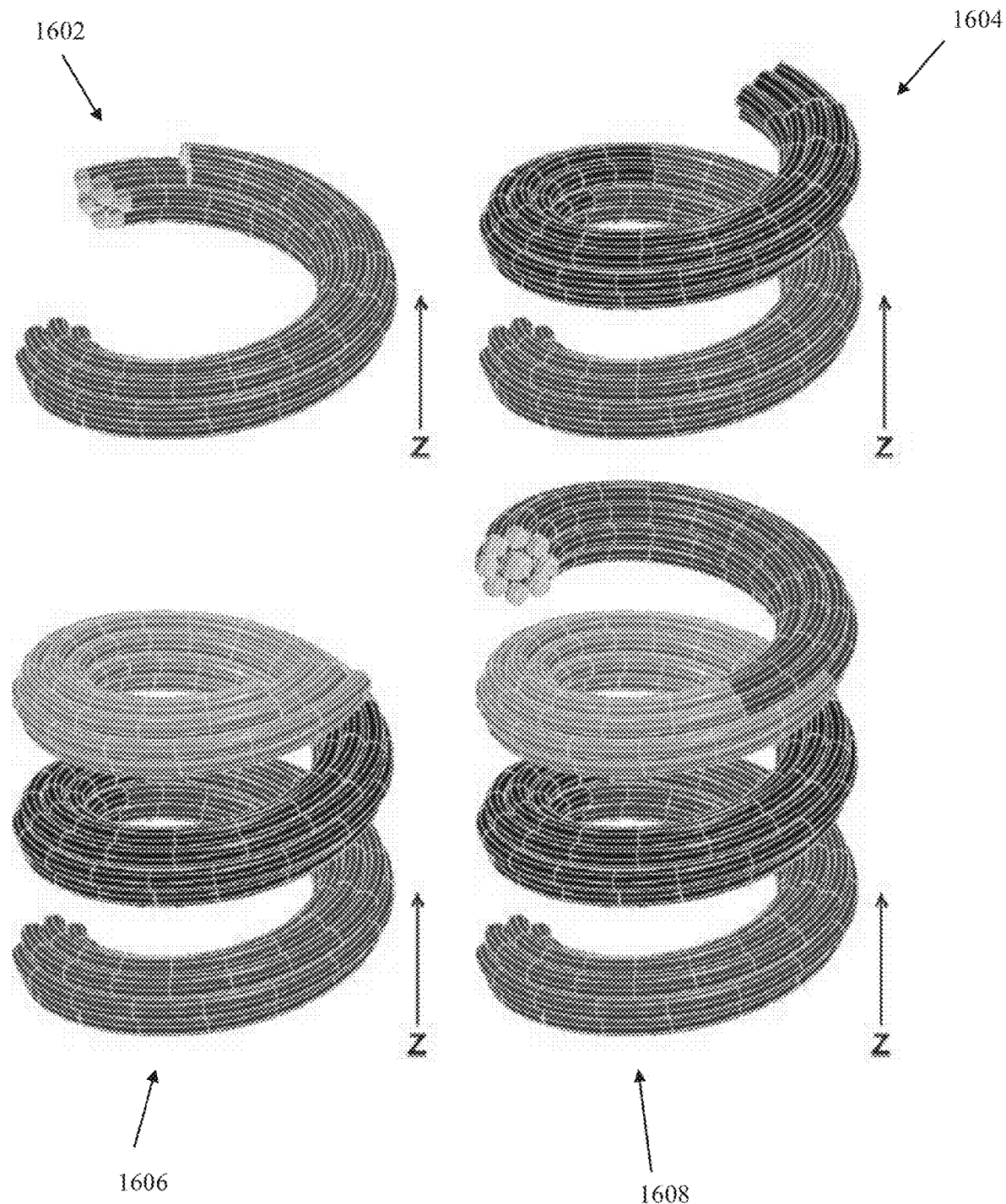
FIG. 16 is a schematic depicting the process of ordering curves for printing a helical 3D object covered by a set of nine curves, in accordance with some embodiments of the present invention.

Reference is now made to FIG. 16, which is a schematic depicting the process of ordering the curves for printing a helical object covered by a set of nine curves, in accordance with some embodiments of the present invention. The curves covering the helical object are printed based on the process of ordering the curves (as described herein) that prevents gouging of lower curves as the helix is being printed. Image 1602 depicts the printed first 9 segments. Image 1604 depicts the printed first 18 segments. Image 1606 depicts the printed first 27 segments. Image 1608 depicts the printed first 36 segments, completing the model.

Optionally, each curve-member of the set of univariate curves is assigned a value for a parameter (optionally an effective coverage radius) denoting the amount of local material for deposition by a 3D printing head when the respective curve-member is used as a printing path. The parameter may be variably defined along the length of each curve-member, for example, the value may vary for each point along the length. The assignment of the value provides a technical solution to the technical problem of controlling the amount of deposited material along the path. For example, in traditional AM methods, covering the same location with more than one covering curve is problematic: when a point is covered more than once, material will also be deposited there multiple times, resulting in excess material being placed. The value for the parameter for each curve is selected by taking into account that print-paths based on the set of curves (created by the systems and/or methods described herein) that are not necessarily parallel to each other, and the distance between adjacent curves may vary along their lengths. To reduce the amount of excess material extruded when locations are covered by multiple (or too closely packed) curves, the volume of each curve is set in a way that ensures locations are not covered by too many curves, and consequently applied too much material.

Optionally, each curve (at one or more points) is assigned a value of a parameter denoting an effective coverage radius indicating the local material deposition radius. Optionally, when the deposited material along the print path is implemented by tracing a virtual tube, the effective coverage radius sets the local radius of the tube (optionally, the cross section of the tube is not circular).

The radius for each curve may be computed, for example, based on the process of the subdivision into sub-curves, similar to the described division processed used to approximate $G_a$. For each sub-curve, the closest sub-curves from other curves are found, and the radius is set according to those neighboring sub-curves. Optionally, the radius is set to be half the distance to the closest neighbor. However, in some cases, the half distance may be too conservative.

Figure 17:
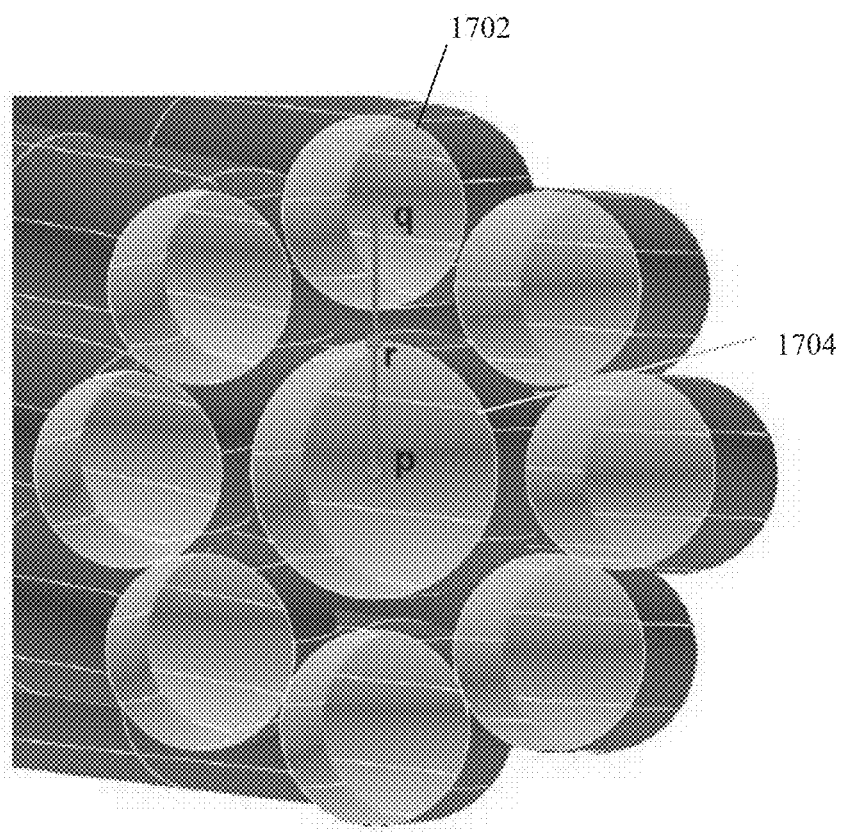
FIG. 17 is a schematic depicting the process of selecting the material's deposition radius for curves, in accordance with some embodiments of the present invention.

Reference is now made to FIG. 17, which is a schematic depicting the process of selecting the material deposition radius for curves, in accordance with some embodiments of the present invention. FIG. 17 may represent a close-up of the nine curves of the helical object of FIG. 16. The outer ring of curves 1702 are closer to one another than to a central curve 1704. An excessive amount of empty space may result around central curve 1704. For example, the excessive amount of empty space may result when the effective coverage radius of curves 1702 and 1704 is set to half the distance to the closest neighbor. The radius of central curve 1704 is set according to the distance between point p and point r, where r=(p+q)/2, where q denotes a point on the upper exterior curve 1702. Empty space is left around central tube 1704 when the radius values for exterior tubes 1702 are set according to the distance from other exterior tubes 1702 rather than to central curve 1704.

The empty space may be reduced or prevented, for example, by selecting the radius for curves 1702 and 1704 so that each curve touches another. However, given the underlying packing issue it may be difficult to completely fill the entire volume. Alternatively, the 2D space may be approximated in planar normal sections along the sub-curve by computing (an approximation of) the corresponding 2D Voronoi cell, for example, and setting the radius of each curve according to the area of the respective Voronoi cell. Optionally, printing paths with non-circular sections, as is usually the case, should be considered.

Optionally, a support volume is defined for the set of univariate curves. The support elements are designated to be printed before printing a portion of the set of univariate curves located just above the respective support elements. The support elements help ensure that the printed parts of the 3D object are supported, and that the order between the 3D object and the support elements is maintained. The support volume may be computed, for example, using ray casting. For example, using vertical rays, in a grid, using, optionally a tessellated version of, the boundary surfaces of the received 3D object. The support volume is filled using support elements according to a defined density. For example, using L-shaped curves, a grid, or other implementations. Additional detail of minimal support elements used in AM may be found, for example, with reference to Ben Ezair, Fady Massarwi, and Gershon Elber. Orientation analysis of 3d objects toward minimal support volume in 3d-printing. *Computers & Graphics*, 51:117-124, 2015.

Figure 18:
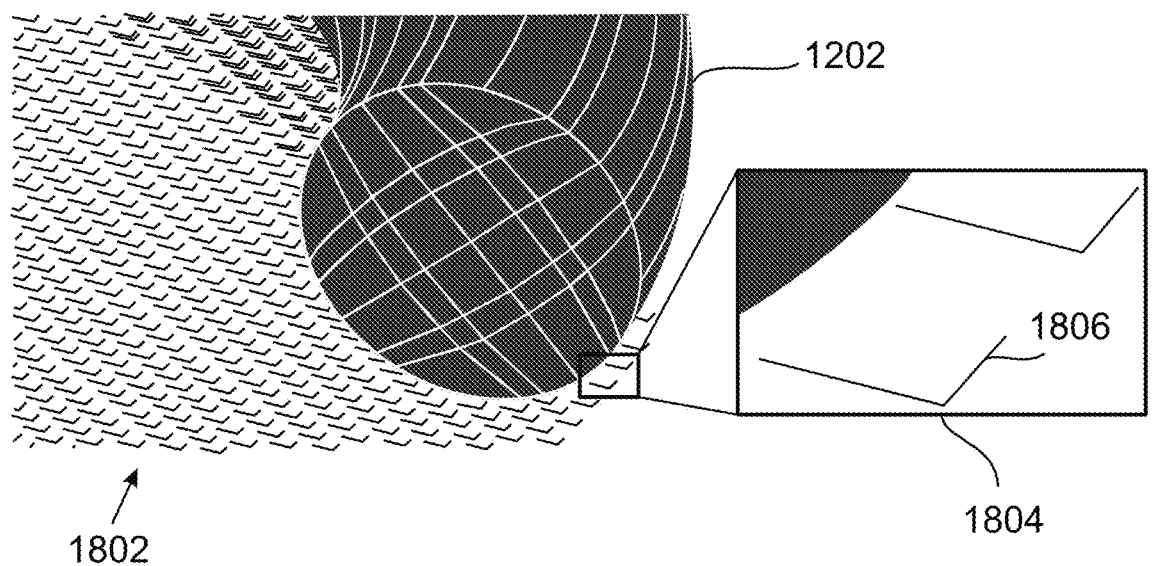
FIG. 18 is a schematic depicting support elements, in accordance with some embodiments of the present invention.

Reference is now made to FIG. 18, which is a schematic depicting L-shaped support elements, in accordance with some embodiments of the present invention. Schematic 1802 is a close up of helical object and support structure 1202 of FIG. 12. Block 1804 is a further zoom-in view of helix 1202 and L-shaped support structure 1806.

Referring now back to FIG. 1B, optionally, at 113, material (e.g., graded) information is added in association with one or more curves, for example, the material used when manufacturing graded-material 3D objects, 3D printing each curve. The material information may be provided, for example, manually entered by a user, retrieved from a storage device storing exemplary material information, and/or automatically generated by analysis code.

At 114, the representation of the 3D object is generated based on the set of curves, as described with reference to FIG. 1A. For example, the set of curves may be stored in a format suitable for printing the 3D object by an AM device.

Optionally, at 116, a physical object based on the 3D geometric object is manufactured, for example, printed by an additive manufacturing system, using a CNC based system, or other manufacturing systems, using the set of univariate curves as printing paths and/or tool guiding paths.

When every point in the received 3D geometric object is covered within the tolerance requirement, every location within the 3D object is 3D printed.

The systems and/or methods described herein, in accordance with some embodiments of the present invention, may be used to distribute curves in a volume. Alternatively or additionally, fiber placement and/or composite material manufacturing is performed by using the set of univariate curves as layout paths.

The systems and/or methods (e.g., code executable by processor(s)) described herein that create the set of univariate curves provide extra freedom using the general representation of the curves, which produces superior AM print-paths, and creates improved 3D models.

Figure 12:
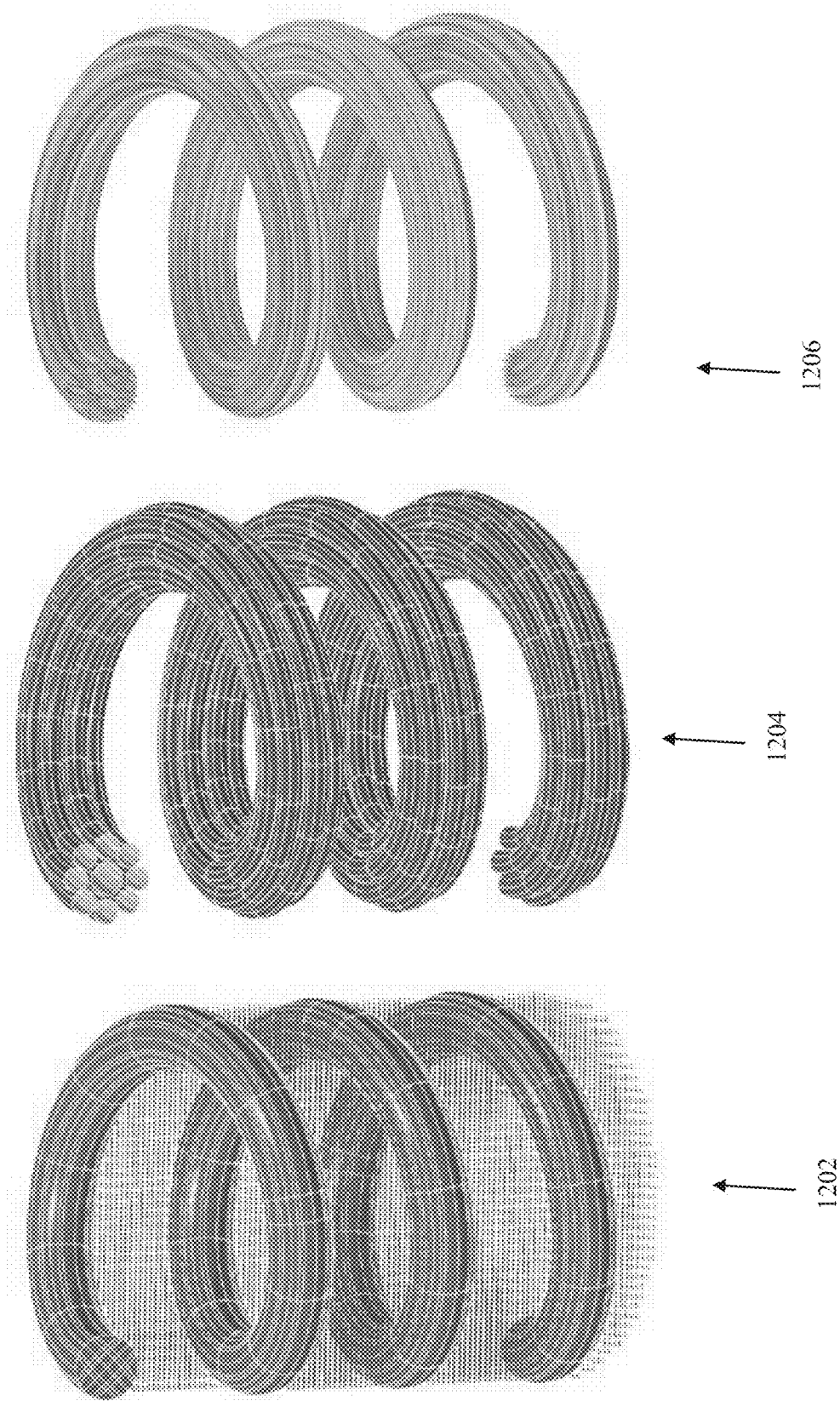
FIG. 12 is a schematic of the process of creating the set of curves that are used to 3D print the geometric object, in accordance with some embodiments of the present invention.

Reference is now made to FIG. 12, which is a schematic of the process of creating the set of curves that are used to 3D print the geometric object, in accordance with some embodiments of the present invention. Image 1202 depicts a helix with support structure for processing into the set of curves. Image 1204 depicts nine curves that are computed for the helix of image 1202. The value of the radius of the curves control the diameter of each tube. Image 1206 includes about 270 covering curves with radius values controlling the diameter of the depicted tubes, after splits due to accessibility analysis. Printing the helical object of image 1206 using the curves (which follow the general shape of the helix) as print-paths creates an improved 3D printed model, for example, with improved surface finish and/or superior mechanical strength, for example, in comparison to printing using standard slicing methods, for example, as described with reference to Prashant Kulkarni, Anne Marsan, and Debasish Dutta. A review of process planning techniques in layered manufacturing. *Rapid Prototyping Journal*, 6(1):18-35, 2000.

It is noted that alternatively, the set of covering curves may be used for example, for geometric modeling of anisotropic heterogeneous materials such as composite materials, and/or placement of fibers. Having a (trimmed) trivariate representation, optional volumetric field information, such as material properties and/or stiffness requirements, might be specified and propagated via the general univariate curve covering, to the 3D printer, fully supporting the AM of graded-, heterogeneous, and anisotropic-materials.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

It is expected that during the life of a patent maturing from this application many relevant additive manufacturing system will be developed and the scope of the term additive manufacturing system is intended to include all such new technologies a priori.

As used herein the term "about" refers to ±10%.

The terms "comprises", "comprising", "includes", "including", "having" and their conjugates mean "including but not limited to". This term encompasses the terms "consisting of" and "consisting essentially of".

The phrase "consisting essentially of" means that the composition or method may include additional ingredients and/or steps, but only if the additional ingredients and/or steps do not materially alter the basic and novel characteristics of the claimed composition or method.

As used herein, the singular form "a", "an" and "the" include plural references unless the context clearly dictates otherwise. For example, the term "a compound" or "at least one compound" may include a plurality of compounds, including mixtures thereof.

The word "exemplary" is used herein to mean "serving as an example, instance or illustration". Any embodiment described as "exemplary" is not necessarily to be construed as preferred or advantageous over other embodiments and/or to exclude the incorporation of features from other embodiments.

The word "optionally" is used herein to mean "is provided in some embodiments and not provided in other embodiments". Any particular embodiment of the invention may include a plurality of "optional" features unless such features conflict.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. A method of representing the volume of a three dimensional (3D) object for additive manufacturing of the 3D object, comprising:
   receiving an initial definition of a 3D object representation defining virtual limits in space of a volume of the 3D object;
   calculating, by at least one hardware processor, a set of a plurality of 3D univariate curves that fill the initial definition of the volume of the 3D object representation within a tolerance requirement of the plurality of 3D univariate curves, by dividing the volume enclosed by the boundaries of the 3D representation defining virtual limits in space of volume of the 3D object, into a plurality of discrete volumetric cells, covering each cell by tracing a freeform curve from the center of each respective discrete cell, wherein all accessible cells without any other cell below them are uniquely covered by curves and removed from the 3D object, until no more uncovered cells remain, and further comprising terminating the tracing of the freeform curve when another covered discrete cell is encountered or when the freeform curve leaves the volume of the respective discrete cell; and
   generating a representation of the 3D object based on the set of 3D univariate curves that fill the volume of the 3D object, wherein the set of 3D univariate curves that fill the volume of the 3D object define printing paths for a 3D printing head of an additive manufacturing system for additive manufacturing of the 3D object.

2. The method of claim 1, wherein the set of univariate curves are calculated based on a plurality of non-planar bivariate parametric surfaces covering wherein the 3D object, wherein the 3D object comprises at least one trivariate, within the tolerance requirement, and further comprising fitting each of the plurality of surfaces with at least one univariate curve.

3. The method of claim 2, wherein the plurality of non-planar bivariate parametric surfaces are iso-parametric surfaces of a trivariate parametric volume representation of the 3D object representation, wherein the at least one univariate curve is an iso-parametric curve of a trivariate parametric volume representation of the 3D object representation.

4. The method of claim 1, further comprising defining at least one external directional vector field enclosing the 3D object, and wherein calculating comprises fitting each of the plurality of curves according to the at least one external directional vector field to create the set of univariate curves, and clipping the plurality of curves to be inside the boundaries of the 3D object defining virtual limits in space of volume of the 3D object.

5. The method of claim 4, wherein the at least one external directional vector field represents one or more property selected from the group consisting of: color, transparency, a surface finish, a mechanical strength or stiffness, and graded-, anisotropic-, heterogeneous-material properties, and each of such field further comprising assigning to each curve-member of the set of univariate curves, a value for a parameter denoting the field's value when the respective curve-member is used as a printing path, wherein the parameter is variable along the length of each curve-member.

6. The method of claim 1, wherein the volume enclosed by the boundaries of the 3D representation is divided into dexel (depth) cells.

7. The method of claim 1, wherein the freeform curve is traced following a direction according to an external vector field.

8. The method of claim 1, wherein calculating comprises creating the set of univariate curves in the domain of each trivariate in the 3D object and mapping the curves, using curve-trivariate function composition, to Euclidean space.

9. The method of claim 1, wherein the 3D object comprises at least one member of the group consisting of: at least one trimmed trivariate, at least one trivariate.

10. The method of claim 1, further comprising performing at least one of fiber placement and composite material manufacturing using the set of univariate curves as layout paths.

11. The method of claim 1, further comprising ordering the set of univariate curves for printing by the 3D printing head along each curve-member of the set of univariate curves, wherein the ordering is selected such that during the 3D printing process curves that are not yet printed and have no unprinted curves below them are printed.

12. The method of claim 11, further comprising computing a directed graph that stores the ordering of printing the set of univariate curves, wherein each curve-member is assigned to a vertex of the directed graph, and a directed edge between two vertexes exists when a first of the two vertexes is below a second of the two vertexes relative to the 3D printing head, in full 3-axis additive manufacturing 3D printing, wherein when the directed graph is acyclic the directed graph represents a 3D printable ordering of the set of univariate curves.

13. The method of claim 12, further comprising, identifying a cycle in the directed graph that represents an impossible-to-print subset of univariate curves, and dividing at least one of the subset of univariate curves to remove the cycle from the directed graph.

14. The method of claim 11, further comprising computing a directed graph that stores the ordering of printing the set of univariate curves, wherein each curve-member is assigned to a vertex of the directed graph, and a directed edge between two vertexes exists when a first of the two vertexes is below a second of the two vertexes relative to the 3D printing head, in 5-axis additive manufacturing 3D printing, wherein when the directed graph is acyclic the directed graph represents a 3D printable ordering of the set of univariate curves.

15. The method of claim 12, wherein the directed graph is computed by dividing each curve-member of the set of univariate curves into a plurality of fragments each having a length less than a fragmentation tolerance corresponding to a minimum height of material deposited by the 3D printing head, and iteratively merging pairs of the plurality of fragments while maintaining an acyclic directed graph.

16. The method of claim 1, further comprising assigning to each curve-member of the set of univariate curves, a value for a parameter denoting an effective coverage radius indicative of the amount of local material for deposition by the 3D printing head when the respective curve-member is used as a printing path, wherein the parameter is variable along the length of each curve-member.

17. The method of claim 1, further defining a support volume for the set of univariate curves, and representing the support volume using support elements, wherein the support elements are printed before printing a portion of the set of univariate curves.

18. A system for processing of a three dimensional (3D) object for manufacturing, comprising:
a program store storing code; and
a processor coupled to the program store for implementing the stored code, the code comprising:
code to receive an initial definition of the 3D object defining virtual limits in space of a volume of the 3D object, calculate a set of a plurality of 3D univariate curves that fill the initial definition of the volume of the 3D object within a tolerance requirement of the plurality of 3D univariate curves, by dividing the volume enclosed by the boundaries of the 3D representation defining virtual limits in space of volume of the 3D object, into a plurality of discrete volumetric cells, covering each cell by tracing a freeform curve from the center of each respective discrete cell, wherein all accessible cells without any other cell below them are uniquely covered by curves and removed from the 3D object, until no more uncovered cells remain, and further comprising terminating the tracing of the freeform curve when another covered discrete cell is encountered or when the freeform curve leaves the volume of the respective discrete cell, and generate a representation of the 3D object based on the set of 3D univariate curves that fill the volume of the 3D object, wherein the covering set of 3D univariate curves that fill the volume of the 3D object define printing paths for a 3D printing head of an additive manufacturing system for additive manufacturing of the 3D object.

19. A method of representing the volume of a three dimensional (3D) object for additive manufacturing of the 3D object, comprising:
receiving an initial definition of a 3D object representation defining virtual limits in space of a volume of the 3D object;
calculating, by at least one hardware processor, a set of a plurality of 3D univariate curves that fill the initial definition of the volume of the 3D object representation within a tolerance requirement of the plurality of 3D univariate curves;
ordering the set of the plurality of 3D univariate curves for printing by a 3D printing head along each curve-member of the set of the plurality of 3D univariate curves, wherein the ordering is selected such that during the 3D printing process curves that are not yet printed and have no unprinted curves below them are printed;
computing a directed graph that stores the ordering of printing the set of the plurality of 3D univariate curves, wherein each curve-member is assigned to a vertex of the directed graph, and a directed edge between two vertexes exists when a first of the two vertexes is below a second of the two vertexes relative to the 3D printing head, in full 3-axis and/or 5-axis additive manufacturing 3D printing, wherein when the directed graph is acyclic the directed graph represents a 3D printable ordering of the set of univariate curves; and generating a representation of the 3D object based on the set of 3D univariate curves that fill the volume of the 3D object, wherein the set of 3D univariate curves that fill the volume of the 3D object define printing paths for the 3D printing head of an additive manufacturing system for additive manufacturing of the 3D object.

* * * * *